United States Patent
Norwood et al.

(10) Patent No.: US 10,187,707 B2
(45) Date of Patent: Jan. 22, 2019

(54) HOME INTELLIGENCE SYSTEM

(71) Applicant: Curb Inc., Austin, TX (US)

(72) Inventors: Erik Norwood, Austin, TX (US); Josh Bohde, Austin, TX (US); Eric Gould Bear, Austin, TX (US)

(73) Assignee: Curb, Inc., Austin, TX (US)

( * ) Notice: Subject to any disclaimer, the term of this patent is extended or adjusted under 35 U.S.C. 154(b) by 0 days.

(21) Appl. No.: 14/944,118

(22) Filed: Nov. 17, 2015

(65) Prior Publication Data
US 2016/0212506 A1 Jul. 21, 2016

Related U.S. Application Data

(60) Provisional application No. 62/080,949, filed on Nov. 17, 2014.

(51) Int. Cl.
| | |
|---|---|
| *H04Q 9/00* | (2006.01) |
| *G01R 21/133* | (2006.01) |
| *H02J 3/00* | (2006.01) |

(52) U.S. Cl.
CPC ............ *H04Q 9/00* (2013.01); *G01R 21/133* (2013.01); *G01R 21/1338* (2013.01); *H02J 3/00* (2013.01); *H04Q 2209/60* (2013.01)

(58) Field of Classification Search
CPC ....... G06Q 50/06; H04Q 9/00; H04Q 2209/60
(Continued)

(56) References Cited

U.S. PATENT DOCUMENTS

| | | |
|---|---|---|
| 5,566,084 A | 10/1996 | Cmar |
| 6,122,603 A | 9/2000 | Budike, Jr. |

(Continued)

FOREIGN PATENT DOCUMENTS

| | | |
|---|---|---|
| EP | 1984858 A2 | 10/2008 |
| EP | 2033060 A2 | 3/2009 |

(Continued)

OTHER PUBLICATIONS

"PowerWise Products: The eMonitor and more", webpage, PowerWise Systems, 4 pages, Jun. 20, 2013, Blue Hill, Maine, US.
(Continued)

*Primary Examiner* — Joseph H Feild
*Assistant Examiner* — Sharmin Akhter
(74) *Attorney, Agent, or Firm* — Meyertons, Hood, Kivlin, Kowert & Goetzel, P.C.

(57) ABSTRACT

A system for providing information about electrical devices in a residence includes a power measurement device, an electrical device identification component, and a notification component. The power measurement device measures characteristics of electrical power in one or more electrical power lines in the residence. Based on the measured electrical characteristics, the electrical device identification component determines electrical signatures specific electrical devices at the residence that are receiving electrical power through the electrical power lines, associates the electrical devices with a device type, and groups the electrical devices into zones of the residence. Based on power consumption by the specific electrical devices, the notification component determines events or conditions associated with specific electrical devices (for example abnormal usage, device failure, excess power consumption). Notifications relating to at least one of the events or conditions associated with the specific electrical devices are provided to a person associated with the residence (for example, homeowner or other resident).

26 Claims, 25 Drawing Sheets

(58) Field of Classification Search
USPC .................. 340/870.02, 12.28–12.29, 12.54, 340/539.1–539.15
See application file for complete search history.

(56) References Cited

U.S. PATENT DOCUMENTS

| | | |
|---|---|---|
| 6,366,889 B1 | 4/2002 | Zaloom |
| 6,587,754 B2 | 7/2003 | Hung et al. |
| 6,937,946 B1 | 8/2005 | Culp et al. |
| 6,956,500 B1 | 10/2005 | Ducharme et al. |
| 6,996,508 B1 | 2/2006 | Culp et al. |
| 7,089,089 B2 | 8/2006 | Cumming et al. |
| 7,127,328 B2 | 10/2006 | Ransom |
| 7,130,719 B2 | 10/2006 | Ehlers et al. |
| 7,188,003 B2 | 3/2007 | Ransom et al. |
| 7,225,089 B2 | 5/2007 | Culp et al. |
| 7,246,014 B2 | 7/2007 | Forth et al. |
| 7,343,226 B2 | 3/2008 | Ehlers et al. |
| 7,373,221 B2 | 5/2008 | Lal |
| 7,379,997 B2 | 5/2008 | Ehlers et al. |
| 7,409,303 B2 | 8/2008 | Yeo et al. |
| 7,418,428 B2 | 8/2008 | Ehlers et al. |
| 7,516,106 B2 | 4/2009 | Ehlers et al. |
| 7,552,033 B1 | 6/2009 | Culp et al. |
| 7,693,670 B2 | 4/2010 | Durling et al. |
| 7,761,910 B2 | 7/2010 | Ransom et al. |
| 7,766,231 B2 | 8/2010 | Oldham et al. |
| 7,885,917 B2 | 2/2011 | Kuhns et al. |
| 7,949,615 B2 | 5/2011 | Ehlers et al. |
| 7,979,239 B2 | 7/2011 | Trias |
| 8,063,775 B2 | 11/2011 | Reed et al. |
| 8,131,401 B2 | 3/2012 | Nasle |
| 8,155,908 B2 | 4/2012 | Nasle et al. |
| 8,160,752 B2 | 4/2012 | Weaver et al. |
| 8,200,370 B2 | 6/2012 | Paik |
| 8,229,722 B2 | 7/2012 | Nasle |
| 8,255,554 B2 | 8/2012 | Andrade et al. |
| 8,286,191 B2 | 10/2012 | Amini et al. |
| 8,326,793 B1 | 12/2012 | Bowers et al. |
| 8,355,827 B2 | 1/2013 | Egnor et al. |
| 8,370,283 B2 | 2/2013 | Pitcher et al. |
| 8,374,725 B1 | 2/2013 | Ols |
| 8,396,821 B2 | 3/2013 | Kuhns et al. |
| 8,412,147 B2 | 4/2013 | Hunter et al. |
| 8,447,541 B2 | 5/2013 | Rada et al. |
| 8,461,725 B1 | 6/2013 | Stubbs et al. |
| 8,521,336 B2 | 8/2013 | Paik |
| 8,527,223 B2 | 9/2013 | AbuAli et al. |
| 8,538,484 B2 | 9/2013 | Chan et al. |
| 8,560,134 B1 | 10/2013 | Lee |
| 8,577,661 B2 | 11/2013 | Nasle |
| 8,606,686 B1 | 12/2013 | Ippolito et al. |
| 8,620,841 B1 | 12/2013 | Filson et al. |
| 8,660,868 B2 | 2/2014 | Vogel et al. |
| 8,676,953 B2 | 3/2014 | Koch |
| 8,706,308 B2 | 4/2014 | Reichmuth et al. |
| 8,719,184 B2 | 5/2014 | Buchanan |
| 8,719,186 B2 | 5/2014 | Amram et al. |
| 8,751,427 B1 | 6/2014 | Mysen et al. |
| 8,761,944 B2 | 6/2014 | Drew et al. |
| 8,825,671 B1 | 9/2014 | Nordstrom |
| 8,832,003 B1 | 9/2014 | Bowers et al. |
| 8,850,348 B2 | 9/2014 | Fadell et al. |
| 8,886,625 B1 | 11/2014 | Dorner et al. |
| 8,893,032 B2 | 11/2014 | Bruck et al. |
| 8,909,358 B2 | 12/2014 | Kamouskos |
| 8,920,619 B2 | 12/2014 | Salzer et al. |
| 8,924,550 B2 | 12/2014 | Cohen et al. |
| 8,935,393 B1 | 1/2015 | Jackson et al. |
| 8,947,437 B2 | 2/2015 | Garr et al. |
| 8,958,917 B2 | 2/2015 | Wolfe et al. |
| 8,959,006 B2 | 2/2015 | Nasle |
| 8,983,670 B2 | 3/2015 | Shetty et al. |
| 9,009,192 B1 | 4/2015 | Shmiel et al. |
| 9,014,996 B2 | 4/2015 | Kamel et al. |
| 9,015,003 B2 | 4/2015 | Wolfe |
| 9,031,824 B2 | 5/2015 | Nasle |
| 9,032,316 B1 | 5/2015 | Nordstrom et al. |
| 9,056,783 B2 | 6/2015 | Wolfe |
| 9,057,746 B1 | 6/2015 | Houlette et al. |
| 2004/0140908 A1 | 7/2004 | Gladwin et al. |
| 2005/0021580 A1* | 1/2005 | Swanson ............ G01R 23/167 708/405 |
| 2005/0125701 A1 | 6/2005 | Hensbergen et al. |
| 2007/0043477 A1 | 2/2007 | Ehlers et al. |
| 2007/0043478 A1 | 2/2007 | Ehlers et al. |
| 2009/0045976 A1 | 2/2009 | Zoldi et al. |
| 2009/0069861 A1 | 3/2009 | Gandhi et al. |
| 2009/0157529 A1 | 6/2009 | Ehlers et al. |
| 2009/0195349 A1* | 8/2009 | Frader-Thompson ............... G01D 4/002 340/3.1 |
| 2010/0094475 A1 | 4/2010 | Masters et al. |
| 2010/0106575 A1 | 4/2010 | Bixby et al. |
| 2010/0174419 A1* | 7/2010 | Brumfield ............ G01R 22/10 700/295 |
| 2010/0191487 A1 | 7/2010 | Rada et al. |
| 2010/0211509 A1 | 8/2010 | Jacobs |
| 2010/0250015 A1 | 9/2010 | Flikkema |
| 2010/0250440 A1* | 9/2010 | Wang ................ G06Q 10/06 705/63 |
| 2010/0262313 A1 | 10/2010 | Chambers et al. |
| 2010/0289643 A1 | 11/2010 | Trundle et al. |
| 2011/0022242 A1 | 1/2011 | Bukhin et al. |
| 2011/0040785 A1* | 2/2011 | Steenberg .......... G05B 23/0235 707/769 |
| 2011/0109472 A1 | 5/2011 | Spirakis et al. |
| 2011/0119199 A1 | 5/2011 | Waibel |
| 2011/0161250 A1 | 6/2011 | Koeppel et al. |
| 2011/0207995 A1* | 8/2011 | Snow ................ A61F 5/0059 600/37 |
| 2011/0264563 A1 | 10/2011 | Lundberg et al. |
| 2011/0282506 A1 | 11/2011 | Amram et al. |
| 2011/0289019 A1 | 11/2011 | Radloff et al. |
| 2012/0031984 A1 | 2/2012 | Feldmeier et al. |
| 2012/0066397 A1 | 3/2012 | Koch et al. |
| 2012/0089269 A1 | 4/2012 | Weaver et al. |
| 2012/0101653 A1 | 4/2012 | Tran |
| 2012/0221162 A1 | 8/2012 | Forbes, Jr. |
| 2012/0271472 A1 | 10/2012 | Brunner et al. |
| 2012/0316808 A1 | 12/2012 | Frader-Thompson et al. |
| 2013/0046703 A1 | 2/2013 | Ambati et al. |
| 2013/0055132 A1 | 2/2013 | Foslien |
| 2013/0066479 A1 | 3/2013 | Shetty et al. |
| 2013/0073102 A1 | 3/2013 | Bischof et al. |
| 2013/0144451 A1 | 6/2013 | Kumar et al. |
| 2014/0074730 A1 | 3/2014 | Arensmeier et al. |
| 2014/0129160 A1 | 5/2014 | Tran |
| 2014/0195397 A1 | 7/2014 | Ippolito et al. |
| 2014/0207708 A1 | 7/2014 | Amram et al. |
| 2014/0277761 A1 | 9/2014 | Matsuoka et al. |
| 2014/0277769 A1 | 9/2014 | Matsuoka et al. |
| 2014/0277795 A1 | 9/2014 | Matsuoka et al. |
| 2014/0336960 A1 | 11/2014 | Haghighat-Kashani et al. |
| 2014/0371921 A1 | 12/2014 | Weaver et al. |
| 2014/0371922 A1 | 12/2014 | Weaver et al. |
| 2014/0371937 A1 | 12/2014 | Weaver et al. |
| 2014/0371939 A1 | 12/2014 | Weaver et al. |
| 2015/0048679 A1* | 2/2015 | Kotowski ............ H04Q 9/00 307/31 |
| 2015/0051749 A1 | 2/2015 | Hancock et al. |
| 2015/0058064 A1 | 2/2015 | Weaver et al. |
| 2015/0066221 A1 | 3/2015 | Weaver et al. |
| 2016/0132032 A1* | 5/2016 | Bruneel ............. G05B 19/048 700/295 |

FOREIGN PATENT DOCUMENTS

| | | |
|---|---|---|
| EP | 2663955 A2 | 11/2013 |
| EP | 2746886 A2 | 6/2014 |
| WO | 2007095585 A2 | 8/2007 |
| WO | 2008003033 A2 | 1/2008 |
| WO | 2009020684 A1 | 2/2009 |

(56) References Cited

FOREIGN PATENT DOCUMENTS

| WO | 2011101476 A1 | 8/2011 |
| WO | 2012031163 A1 | 3/2012 |
| WO | 2012095870 A2 | 7/2012 |
| WO | 2012099588 A1 | 7/2012 |
| WO | 2012103244 A2 | 8/2012 |
| WO | 2013106923 A1 | 7/2013 |
| WO | 2014164976 A1 | 10/2014 |

OTHER PUBLICATIONS

"Building Monitoring and Energy Management", webpage, PowerWise Systems, 6 pages, Jun. 20, 2013, Blue Hill, Maine, US.

Norwood et al., "System for Promoting Efficient Use of Resources", U.S. Appl. No. 14/469,651, filed Aug. 27, 2014.

International Search Report, Application No. PCT/US15/61178, dated Apr. 8, 2016, 21 pages.

International Search Report, Application No. PCT/US2015/061179, dated Mar. 25, 2016, 32 pages.

Office Action, U.S. Appl. No. 14/469,651, dated Feb. 8, 2017, 19 pages.

Final Office Action, U.S. Appl. No. 14/469,651, dated Sep. 18, 2017, 34 pages.

Interview Summary, U.S. Appl. No. 14/469,651, dated Oct. 16, 2017, 3 pages.

Advisory Action, U.S. Appl. No. 14/469,651, dated Dec. 15, 2017, 4 pages.

* cited by examiner

HOME INTELLIGENCE SYSTEM

PRIORITY CLAIM

This application claims priority to U.S. Provisional Application Ser. No. 62/080,949 entitled "WHOLE HOME INTELLIGENCE SYSTEM WITH DISAGGREGATION OF ELECTRICAL DEVICES AND DEVICE-SPECIFIC NOTIFICATIONS" filed Nov. 17, 2014, which is incorporated herein by reference in its entirety.

BACKGROUND

Field

The present invention relates to the management and use of resources, such as energy. More particularly, the present invention relates to systems and methods for acquiring and transmitting information about resource usage in residences and other buildings.

Description of the Related Art

A typical modern home has numerous electrical devices that serve a variety of purposes. In addition to basic systems such as lighting, air conditioning, and standard kitchen appliances, the modern home a myriad of other electrical devices for leisure activities, communication, personal business, entertainment, exercise, and home security. Each of these electrical devices in the home consumes energy. Also, each of these electrical devices is a potential point of failure and may need to be replaced or repaired, often at an inconvenient time.

As energy costs increase, many energy customers feel powerless and upset about high electricity bills. Homeowners and other energy customers have expressed interest in devices that can help monitor home energy use. Today's tools for monitoring energy may not, however, provide a way for a homeowner to know which devices in a home use the most power and which waste the most energy. Smart home systems have gained significant traction, but none provide a solution that encompasses the entire home. A smart device, for example, is typically a point solution that only controls a single outlet or provides a single function.

SUMMARY

Systems and methods for acquiring and using information about electrical device usage are described. In an embodiment, a system for providing information about electrical devices in a residence includes a power measurement device, an electrical device identification component, and a notification component. The power measurement device measures characteristics of electrical power in one or more electrical power lines in the residence. Based on the measured electrical characteristics, the electrical device identification component determines electrical signatures specific electrical devices at the residence that are receiving electrical power through the electrical power lines, associates the electrical devices with a device type, and groups the electrical devices into zones of the residence. Based on power consumption by the specific electrical devices, the notification component determines events or conditions associated with specific electrical devices (for example abnormal usage, device failure, excess power consumption). Notifications relating to at least one of the events or conditions associated with the specific electrical devices are provided to a person associated with the residence (for example, homeowner or other resident).

In an embodiment, a method of providing information about electrical devices in a residence includes measuring characteristics of electrical power lines in the residence. Based on the measured electrical characteristics, electrical signatures for each of at least two of a plurality of electrical devices at the residence that are receiving electrical power from the electrical power lines. Based on the electrical signatures, electrical devices with a device type. The devices are grouped into zones of the residence. Based on power consumption by specific electrical devices, events or conditions associated with the specific electrical device are determined. Notifications relating to the events or conditions associated with the specific electrical devices are provided to a person associated with the residence.

In an embodiment, a method of providing information about electrical devices in a residence includes measuring characteristics of electrical power lines in the residence. Based on the measured electrical characteristics, electrical signatures electrical devices at the residence are determined. A state or usage level of specific electrical devices are detected wherein the power consumption by the specific electrical device is detected using the electrical signatures for the electrical devices. Based on the state or usage level detected for the specific electrical devices, events or conditions associated with the specific electrical devices are determined. Notifications relating to the events or conditions associated with the specific electrical devices are provided to a person associated with the residence.

In an embodiment, a method of managing electrical devices in a residence includes determining electrical signatures for specific electrical devices at the residence based on measured electrical characteristics. Use of the electrical devices is detected using the electrical signatures for the specific electrical devices. Device-specific notifications are provided to a person associated with the residence. In response to device-specific notifications, electrical devices in the residence are controlled.

In an embodiment, a method of providing information about electrical devices in a residence includes determining electrical signatures for specific electrical devices at the residence based on measured electrical characteristics. Use of the electrical devices is detected using the electrical signatures for the specific electrical devices. Device-specific notifications are provided to a person associated with the residence. Based on the use of the specific electrical device, a suggestion for acquiring one or more products or one or more services is determined. The suggestion is provided to a person associated with the residence.

In an embodiment, a method of managing levels of power consumption of electrical devices used by an organization in its facilities includes measuring one or more characteristics of electrical power lines in a set of one or more buildings in which the organization operates. Based on the measured electrical characteristics, electrical signatures are determined for specific devices of electrical devices at the one or more buildings. Power consumption by specific electrical devices is detected using the electrical signatures. Based on the power consumption detected by the electrical devices, an operating specification for the electrical devices at the buildings is determined. The operating specifications manage power consumption for electrical loads at the set of one or more buildings. The operating specifications may reduce a peak load for the buildings.

In an embodiment, a system includes a plurality of conductors that couple with sensors. The sensors measure characteristics of power in electrical power lines. An analog-to-digital converter receives signals from the electrical power lines and converts the signals from analog signals to digital signals. A processor receives digital signals from the analog-to-digital converter, one or more digital signals perform digital signal processing on at least one of the signals and performs digital signal processing. Based on the digital signal processing, an electrical signature for the electrical devices receiving power from at least one of the electrical power lines is determined.

In an embodiment, an electrical signature capture pre-processing device includes a plurality of conductors, an analog-to-digital converter, and an electrical signature pre-processing component. The conductors couple with electrical sensors that measure characteristics of power in electrical power lines in a building. The electrical signature pre-processing component receives, from the analog-to-digital converter, one or more digital signals. The electrical signature pre-processing component performs digital signal processing on the signals to determine a set of information for computing an electrical signature for at least one specific electrical device in the building. The electrical signature pre-processing component sends information to an electrical signature computation component. The information sent to the electrical signature computation component includes information for determining electrical signatures for specific electrical device in the building. A microcontroller controls one or more of the electrical devices in the building.

Figure 1:
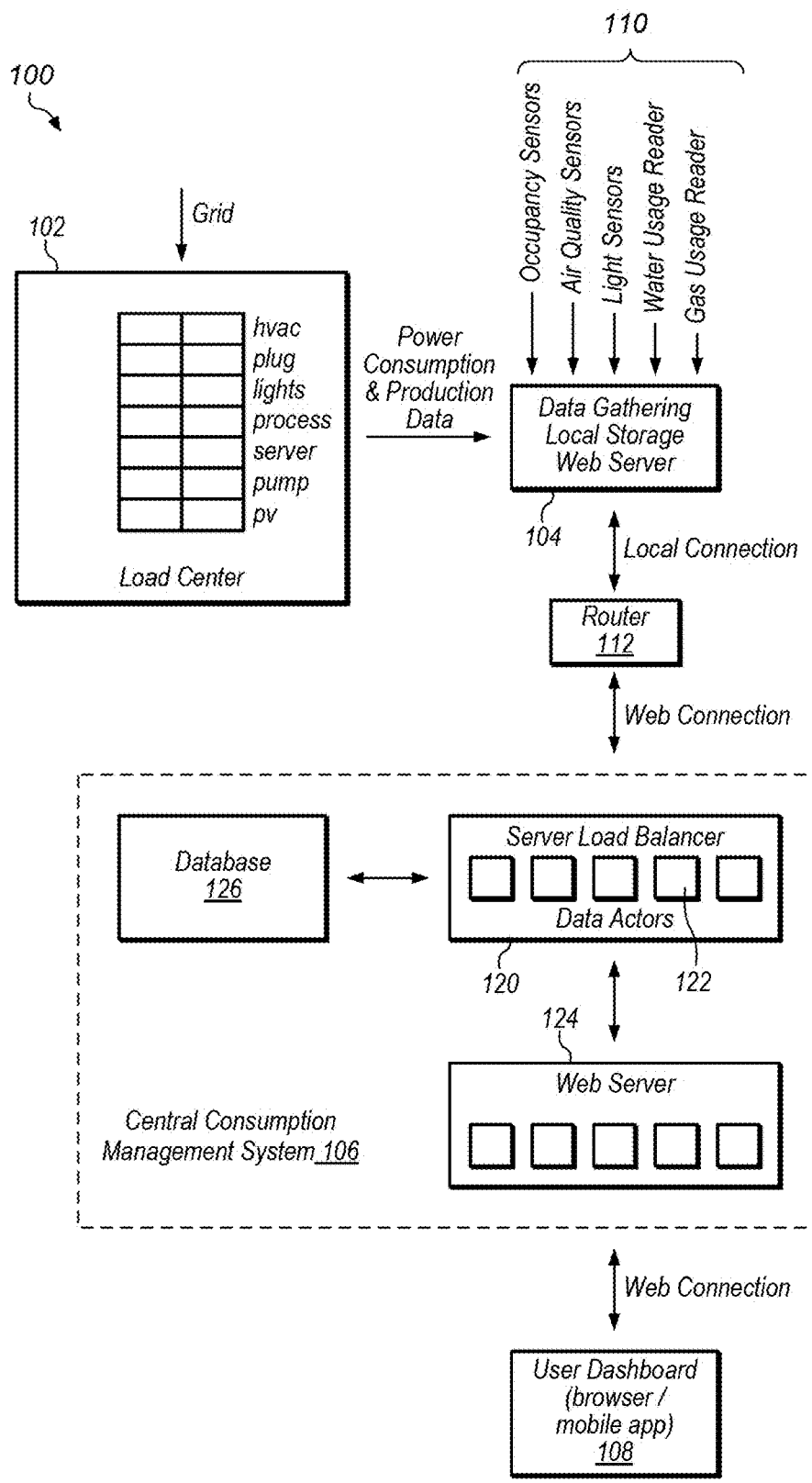
FIG. 1 illustrates one embodiment of a system for promoting lower resource consumption.

While the invention is described herein by way of example for several embodiments and illustrative drawings, those skilled in the art will recognize that the invention is not limited to the embodiments or drawings described. It should be understood, that the drawings and detailed description thereto are not intended to limit the invention to the particular form disclosed, but on the contrary, the intention is to cover all modifications, equivalents and alternatives falling within the spirit and scope of the present invention as defined by the appended claims. The headings used herein are for organizational purposes only and are not meant to be used to limit the scope of the description or the claims. As used throughout this application, the word "may" is used in a permissive sense (i.e., meaning having the potential to), rather than the mandatory sense (i.e., meaning must). Similarly, the words "include", "including", and "includes" mean including, but not limited to.

DETAILED DESCRIPTION OF EMBODIMENTS

As used herein, displaying or presenting a "comparison" includes displaying or presenting information that shows differences between one value and another value. A comparison may be graphical, tabular, or other format. For example, a comparison of power consumption rates by two competitors may be displayed by tabulating usage of the two competitors for a given time period, or by displaying a graph having a different plot for each of the competitors.

As used herein, "entity" includes a person or a group of persons. Some examples of entities include a group of occupants of a building or segment of a building, the employees of a company, a team, a department, a city, a company, a department, or a class of students.

As used herein, to "handicap" means to adjust a value to compensate for one or differences in two or more things being compared.

As used herein, to "normalize" means to adjust one or more values to put the values on a common scale for comparison with another value, or to facilitate a fair comparison between two entities being compared.

As used herein, a "place" means a portion of a space, building, or location that can be occupied by one or more persons. Examples of a place includes an entire building, a floor of a building, a wing of a building, a factory room, a warehouse, a retail store, a place of business, a medical facility, a warehouse, an office, or the energy provided by a single outlet.

As used herein, a "resource" means a source from which a material, energy, or asset can be supplied for the use or benefit of a person or group of persons. Examples of resources include energy, electrical power, water, gas, fuel, and specific qualities of air and light within the building.

As used herein, as it pertains to devices, a "signature" includes any set of information derived from a signals associated with a device that can be used to distinguish the device from other devices. In some embodiments, a signature includes a set of frequencies and corresponding amplitudes of voltage or current. In some embodiments, a signature for a device is derived from measurements taken on electrical power lines that supply power to the device. In some embodiments, a signature is derived from non-intrusive load monitoring.

As used herein, a "suggestion" includes a suggestion, idea, proposal, proposition, recommendation, invitation, or tip. A suggestion may include, for example, a recommendation to acquire a specific product or service, or take a particular action.

As used herein, a "user" means a person or groups of persons that can user or consume one or more resources.

As used herein in the context of observing a process or condition, "real-time" means without delay perceivable by the observer. A real-time display of power consumption may include an actual delay. For example, if a user turns off an appliance, an actual delay may occur before the user's power consumption display reflects the reading due to the time for the computer system to receive load sensor information, recalculate a value, and generate an updated display, and the network to transmit the updated information.

Systems for Providing Information to a User about Electrical Power Consumption

In some embodiments, a system displays current information about a user's consumption of a resource to the user. The user may be an individual person or a group of persons. The display may include real-time updates of the information. Energy consumption information may be refreshed on a frequent basis (for example, up-to-the-second). Resource consumption information may be displayed on any of various displays, including centralized screens, web pages of individual workstations, or mobile devices.

Consumption information may be presented at a compartmentalized level, in real-time. The display may be for a residence, office building, or a portion thereof. Users may receive immediate notice of an increase or decrease power use. Additionally, user may receive notices whether or not the user is looking at a display. Important notices that correspond to energy consumption events or significant billing triggers may be "pushed" to users mobile devices to alert them to change consumption patterns.

In some embodiments, resource consumption information of one or more other users is displayed with resource consumption information of one or more other users or places. For example, consumption information may be presented showing user against user, department against department, and building against building. The data may be normalized to promote fairness (accounting, for example, for capacity, weather differences, varying facility ages) and then displayed so that each person or group can gauge its performance against another user. The comparison may be shown on any suitable time interval. Examples of time intervals for comparison include per second, per hour, per day, per business day, per holiday, per month, per season, and per year.

In displaying resource consumption information, a system may account for multiple variations between the places different users are located. Examples of variations that may be accounted for include building capacity, building age, weather differences, age of systems (for example, air conditioning system), number of occupants, and type of use (factory production, office, medical facility).

In some embodiments, a system includes energy use monitoring devices, such as power meters. The energy monitoring devices feeding information to a power consumption monitoring system may read consumption data down to the circuit level or the plug-level. The system may allow set-ups by a user (for example, a system administrator) and goals to be defined and redefined as needed.

Resource consumption information may be acquired for many different types of places and different users. A user may be individual or a group of individuals (for example, all the occupants on the floor of an office building). In some embodiments, resource consumption information is made accessible individually to each person. For example, each employee of a company may have access to a display showing consumption information for that employee, or showing consumption for a group of persons associated with that employee (for example, all the employees that share a floor of an office building with the employee.) Consumption information may be disseminated using any of various devices, such as a cell phone, tablet, desktop computer, local displays, or kiosks. By presenting information to individual users, the individual consumers receive information for bottom-up decision making. For example, if the system display shows an employee that energy is being wasted by overuse of a particular appliance, that employee can take corrective action to reduce use of that appliance.

FIG. 1 illustrates one embodiment of a system for promoting lower resource consumption. System 100 includes load center 102, data gathering server 104, central consumption management system 106, and dashboard devices 108. Load center 102 and data gathering server 104 may be located in a home, building or other place where users of electricity and other resources (for example, water, gas or air) are located. Data gathering server 104 may be a local storage web server or data may be stored remotely. Load center 102 receives power from the electrical grid and distributes the power any of various loads, including HVAC systems, electrical outlets (plug loads), lights, processes, servers, pumps, and other electrical loads.

Load center 102 may transmit information about electrical power consumption to data gathering server 104. Data gathering server 104 may acquire information from sensors 110. Sensors 110 may be located at any suitable location for gathering information about conditions in or around the building or other place where a user is located.

Data gathering server 104 may be connected to router 112. Data gathering server 104 may exchange information with central consumption management system 106 via location connection to router 112 and a web connection.

Central consumption management system 106 includes server load balancer 120, resource consumption monitoring servers 122, web server 124, and database 126. Server load balancer 120 may balance loads for consumption monitoring servers 126.

Central consumption management system 106 may receive power consumption information and other information from data gathering server 104 for one or more places. In some embodiments, central consumption management system 106 receives information from data gathering servers at multiple places. For example, central consumption management system 106 may receive power consumption from data gathering servers at all of the buildings owned by a particular company, all the retail stores in a particular area, all the residences in a neighborhood, or all the buildings in an office park.

Information may be stored in database 126. Consumption monitoring servers 122 may perform computations, comparisons, and analysis based on information from data gather servers. Consumption monitoring servers 122 may generate displays to users, including individual users at places being monitored. Information for generating displays to users may be transmitted to user dashboard devices 108. Each dashboard device may display consumption information to a user at one or more places being monitored. In one embodiment, consumption information for particular space is displayed to users (for example, office employees) occupying that space. Resource consumption information from other locations may also be displayed, such that a person at one location can compare his or her consumption with that of other persons.

Figure 2:
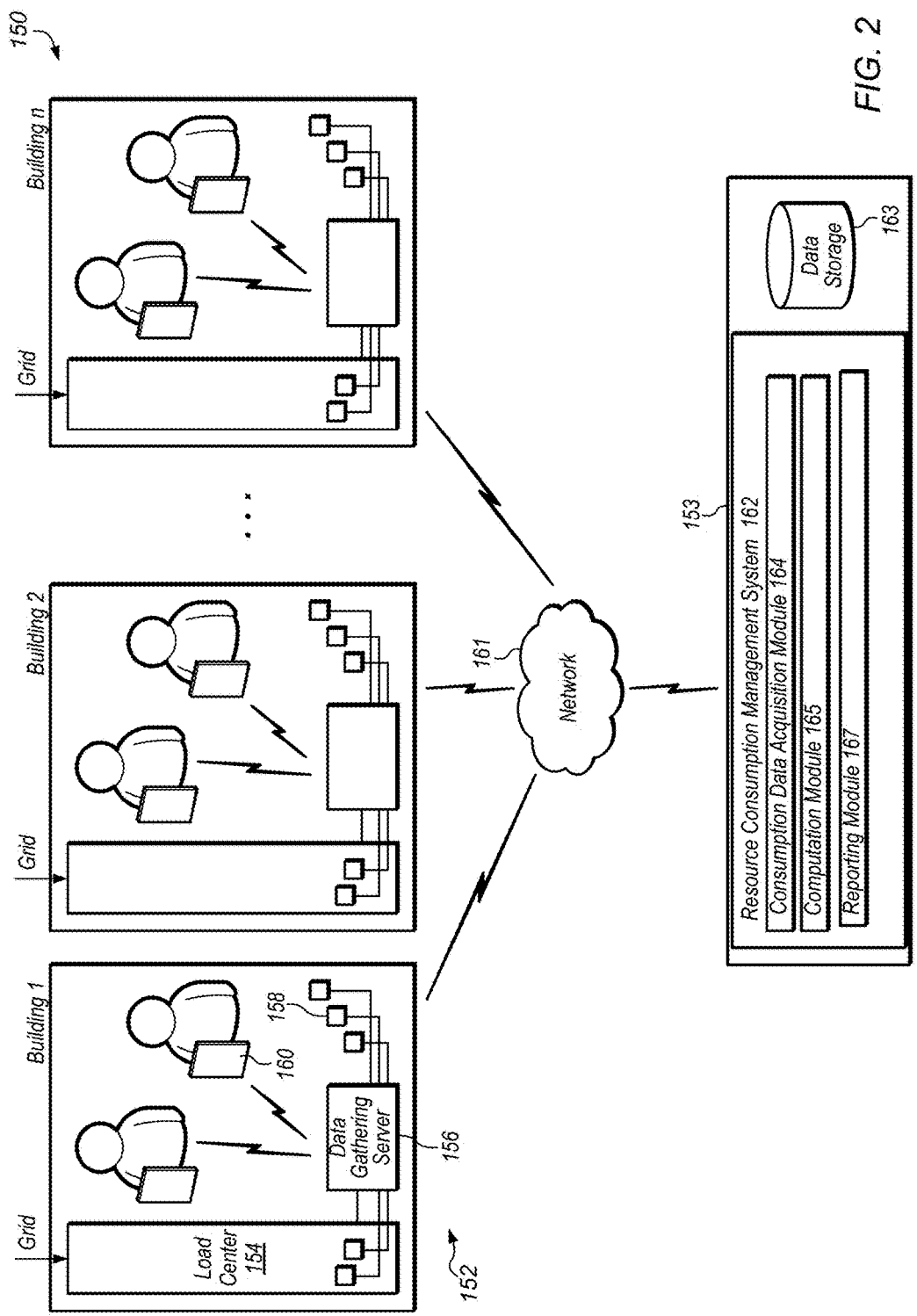
FIG. 2 illustrates one embodiment of a system that monitors and reports resource consumption information from multiple buildings.

FIG. 2 illustrates one embodiment of a system that monitors and reports resource consumption information from multiple buildings. System 150 includes buildings 152 and central consumption management system 153. In some embodiments, each of building 152 is a residence. Each building 152 includes load center 154 and data gathering servers 156, and sensors 158. Employees at building 152 have dashboard devices 160. Load centers 154 and data gathering servers 156 may be located in a home, office, or other place where users of electricity and other resources (for example, water, gas) are located. Load center 154 receives power from the electrical grid and distributes the power to any of various electrical loads.

In the embodiment shown in FIG. 2, three facilities are shown for illustrative purposes. A system for promoting lower resource consumption nevertheless may in various embodiments acquire and report consumption information for any number of places. Resource consumption information may in various embodiments be tracked, analyzed, and reported on a building by building, floor by floor, or other basis.

Central consumption management system 153 may receive power consumption information and other information from data gathering server 156 for one or more places.

In some embodiments, a consumption management system is implemented in the form of components. For example, in one embodiment, central consumption management system 153 includes management system 162 and data storage 163. Resource consumption management system 162 may be coupled to devices, sensors and equipment at facilities 152 by way of network 161. Resource consumption management system 162 includes consumption data acquisition module 164, computation module 165, and reporting module 167.

Central consumption management system 153 may include one or more computing devices. In various embodiments, central consumption management system 153 may be provided by the same computing device or by any suitable number of different computing devices. If any of the components of central consumption management system 153 are implemented using different computing devices, then the components and their respective computing devices may be communicatively coupled, e.g., via a network. Each of the components may described above may include any combination of software and hardware usable to perform their respective functions. It is contemplated that a consumption management system may include additional components not shown, fewer components than described herein, or different combinations, configurations, or quantities of the components than described herein.

Resource usage measurement equipment, such as circuit sensors, may be provided in a system at suitable locations in each facility. In some embodiments, information is gathered for resource consumption measurement is gathered A system may include power consumption measurement devices at a circuit-breaker level. The system may measure various characteristics or conditions of a facility, or resource consumption rates.

Consumption data may be gathered and displayed in real-time. Granularity may be done in any increment. In one embodiment, reporting of consumption is granular to less than 0.5 seconds.

In some embodiments, a comparison of one entity's consumption of a resource is displayed to a person in the entity. The comparison is based on normalized values associated with consumption of the resource. In some cases, consumption by the entity is compared with consumption by the user at a different time or under different conditions (for example, a graph showing current consumption compared with consumption one year ago). In other cases, consumption of the entity is compared with consumption by one or more other entities (for example, a graph comparing the entities consumption for the week with that of other entities.) In some cases, consumption by the entity is compared with consumption goals or objectives set by the user or administrator. This highlights the difference between the actual energy consumption and the set objectives.

In some embodiments, a user is presented with a radial graph that includes a time-wise display of the user's recent consumption of a resource. The display may be presented on a person's office computer, at a central workstation or kiosk, or on a portable electronic device such as a notebook computer, tablet, PDA, or mobile phone.

In some embodiments, the user is an individual user, and the display of the user's own consumption is presented to the user. In other embodiments, the user is a group (for example, the occupants of a building), and the display is presented to two or more persons in the group. The individual user's energy consumption can be identified/estimated without specifically measuring each element that they use that consumes energy. This is accomplished by tracking when users remotely adjust specific load centers. For example, the system will track if a user request for more heat or light in the building and will therefore attributed that additional energy consumption to the individual. Additionally, specific local plug loads (such as desk lamps and computers) energy consumption can be estimated on a time determined basis and then these loads can be attributed to the individual user based on the number of hours the user is within the building.

In some embodiments, information about use of an energy-consuming resource is displayed in a radial graph display. The current level of consumption is indicated by the distance of an indicator (for example, a radially projecting bar) from the center of the display. The display is updated each half second by periodically sweeping around the graph, such as in the motion of a second hand on a clock. The radial graph may automatically scale based on previously collected data for a user such that the user can see both their typical energy consumption at this time period as well as show enough granularity to see small changes in energy consumption In some cases, the radial display may simultaneously display, in radial form, the consumption of other users (for example, other competitors in a game). Related information, such as savings, usage, bill energy, or game results, may be presented on the same screen with the radial graph. In some cases, results of a competition may be graphically displayed (for example, on a line chart) on the same screen as radial display.

Figure 3:
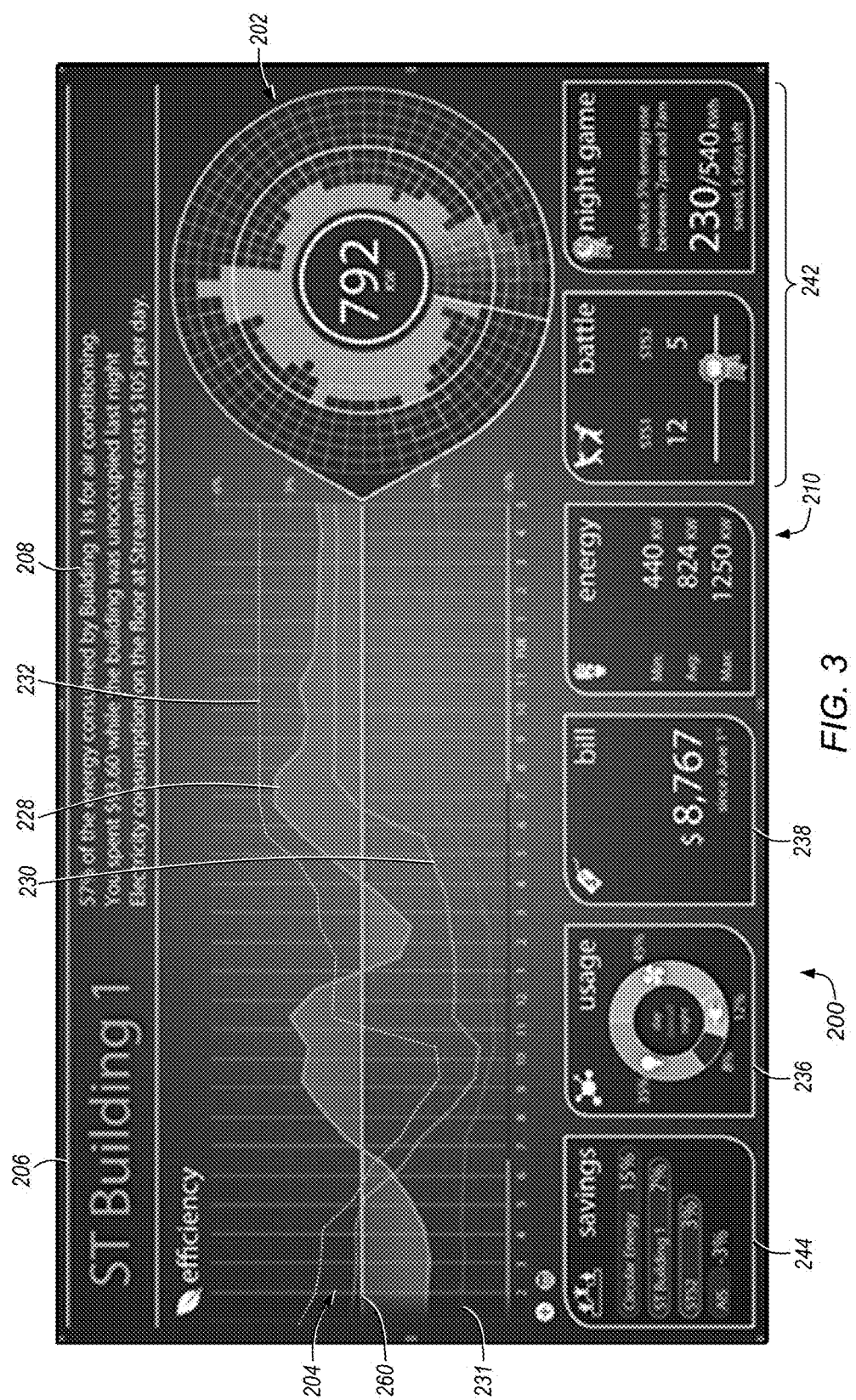
FIG. 3 illustrates one embodiment of a display having a radial graph of power consumption for a user.

In some embodiments, a radial graph shows resource consumption information based on the motion of analog clock in which data is displayed over time by rotating clockwise. FIG. 3 illustrates one embodiment of a display having a radial graph of power consumption for a user. Display 200 includes radial graph 202, line graph 204, place identifier 206, summary panel 208, and information boxes that can be tailored to specific clients needs 210.

Figure 4:
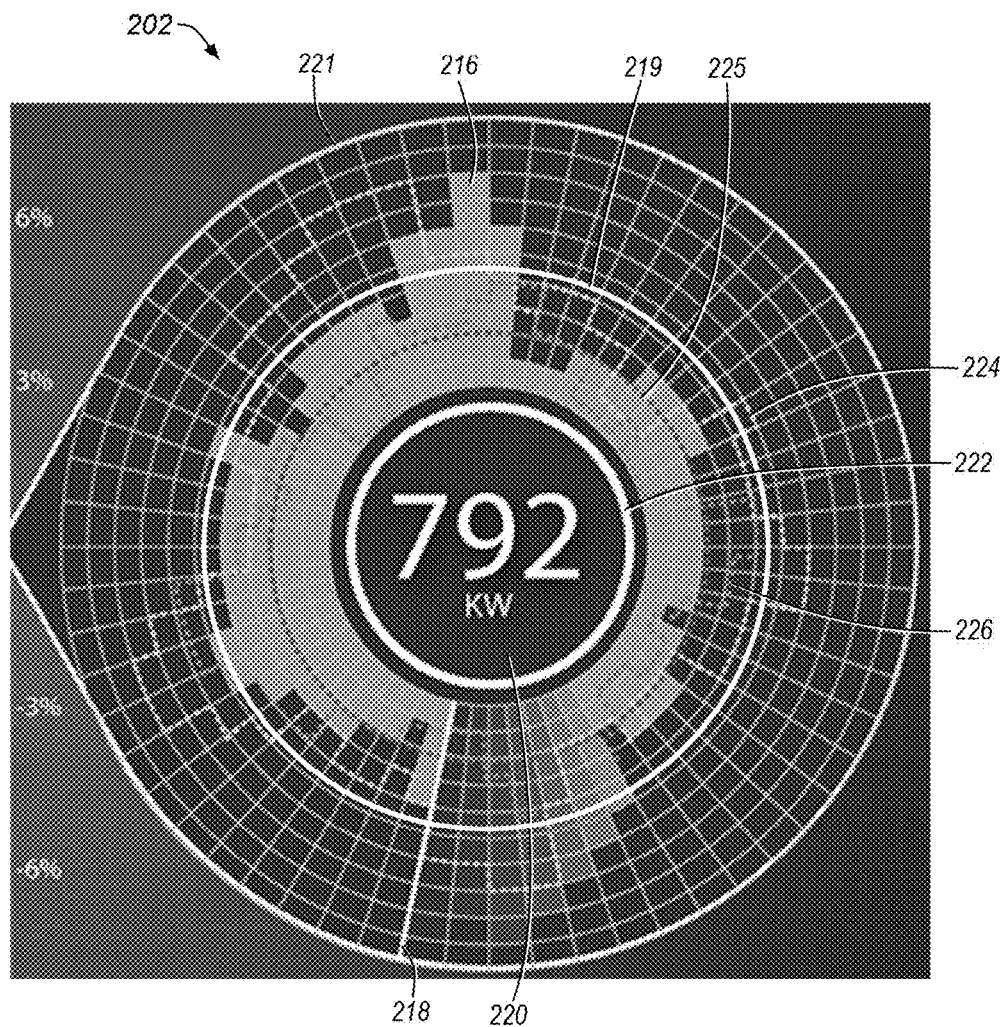
FIG. 4 is a detail view of a radial graph that can be used to report resource consumption.

FIG. 4 is a detail view illustrating a radial graph that can be used to report resource consumption. Radial graph 202 includes bars 216, radial grid 218, baseline indicator 219, instantaneous usage readout 220, and heartbeat ring 222. Current time indicator 218 may advance within circle 221. As current time indicator 218 advances around the circle, bars 216 may appear successively at the location of current time indicator. The length of each of bars 216 (as measured from the common base of the bars) may reflect the magnitude of power usage by the user during a one-second interval. For ease of viewing, the length of each bar 216 may be adjusted to precisely fill a column of boxes in radial grid 218. In certain embodiments, the consumption level for a user may be indicated by the level of light intensity, in addition to, or instead of the length of the consumption level indicators.

Baseline indicator 219 may show one or more base lines established for the user's consumption. Thus, in the illustration shown in FIG. 4, in the part of the graph where the shaded bars 216 are within the circle defined by baseline indicator 219, the user is used less power than the baseline level, while in the part of the graph where the shaded bars 216 project outside of the circle defined by baseline indicator 219, the user consumed power above the baseline level.

In some embodiments, values associated with consumption levels are scaled to make different conditions, circumstances, times, or entities to be comparable. In some embodiments, a user is presented with graphical information on the current usage and historical usage. The user may compare its own current usage versus historical consumption (for example, previous day, month, or year) or against a set goal or objective. A score algorithm may be applied to each competitor. Data may be normalized for the different conditions, circumstances, or times to make a useful comparison. In some embodiments, the system aggregates multiple inputs across multiple devices. The system can configure virtual inputs as values of other physical inputs (for example, A=B+C, A=B−C) and as factors of physical inputs (for example, A=0.3*B).

In some embodiments, data input is scaled such that the graph automatically zooms to show details of minor changes yet expands when increases exceed the graphs boundaries. The radial axis may automatically scale such that relative changes are very noticeable. For example, if over the course of a day if all of the change are within the 3000-4000 W range, the radial axis may only show 3000 to 4000 W and ignore the 0-3000 W range.

At the center of radial graph 202, instantaneous usage readout 220 a number indicates the instantaneous usage. The user may select the units for the reading to different units or equivalent measures, including kWh, dollars, or CO2.

In some embodiments, a radial graph shows usage of one or more other users. For example, in FIG. 4, plot 224 may represent a level of usage for another user an occupant or group of occupants of a different building during the same time period.

Referring again to FIG. 3, line graph 204 is an x-y graph showing usage during recent time period, such as the preceding 24 hours. Plot 228 on the graph represents the user's own consumption. Other plots 230, 231, and 232 may represent consumption of other users during the same time period, by the same user at a different time (for example, the same period one year ago) or a specific targeted goal at that period of time.

In some embodiments, the colors of the graphs are configurable. For example, the user may be able to choose a color of bars 216, any of the plots on radial graph 202 or line graph 204, or both.

Figure 5:
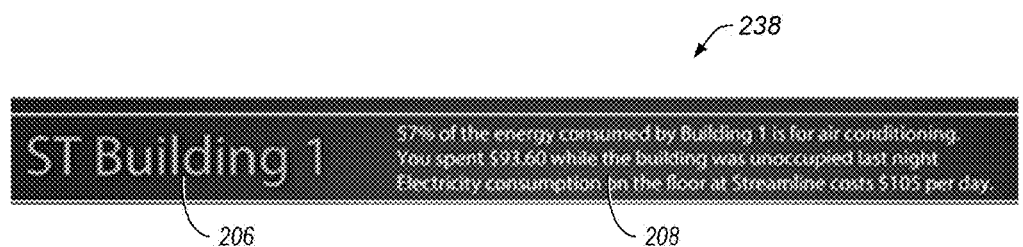
FIG. 5 illustrates a banner for a user display for real-time power consumption by a user. The banner may show specific energy consumption tips and details about which loads are on or off based on the software algorithms.

FIG. 5 illustrates a banner for a user display for real time power consumption by a user. Banner 238 includes place identifier 206 and summary panel 208. Summary panel 208 may provide information, status, or recommendations to a user to promote lower consumption of the resource being monitored. This banner can also alert users about specific resource events. For example, if a device is turned off/on or if the building is approaching a new peak consumption and then give users advice on how to avoid the peak.

Figure 6:
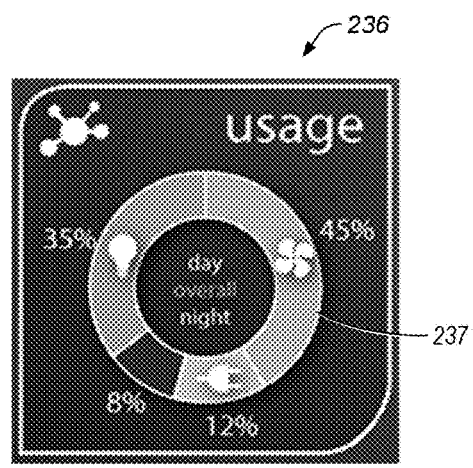
FIG. 6 illustrates one embodiment of a usage box for a display.

Usage information boxes 210 (from FIG. 3) include energy usage box 236, cost box 238, game status/results boxes 242, and savings box 244. One or more of usage information boxes may include a pie graph. Over time period selected the pie graph shows the kwh and percentage of the different components of energy consumption. Center buttons (overall, day, night) change the pie graph to show consumption during night/day or both within the time period selected. FIG. 6 illustrates one embodiment of a usage box for a display. Usage box 236 includes pie chart 237.

Figure 7:
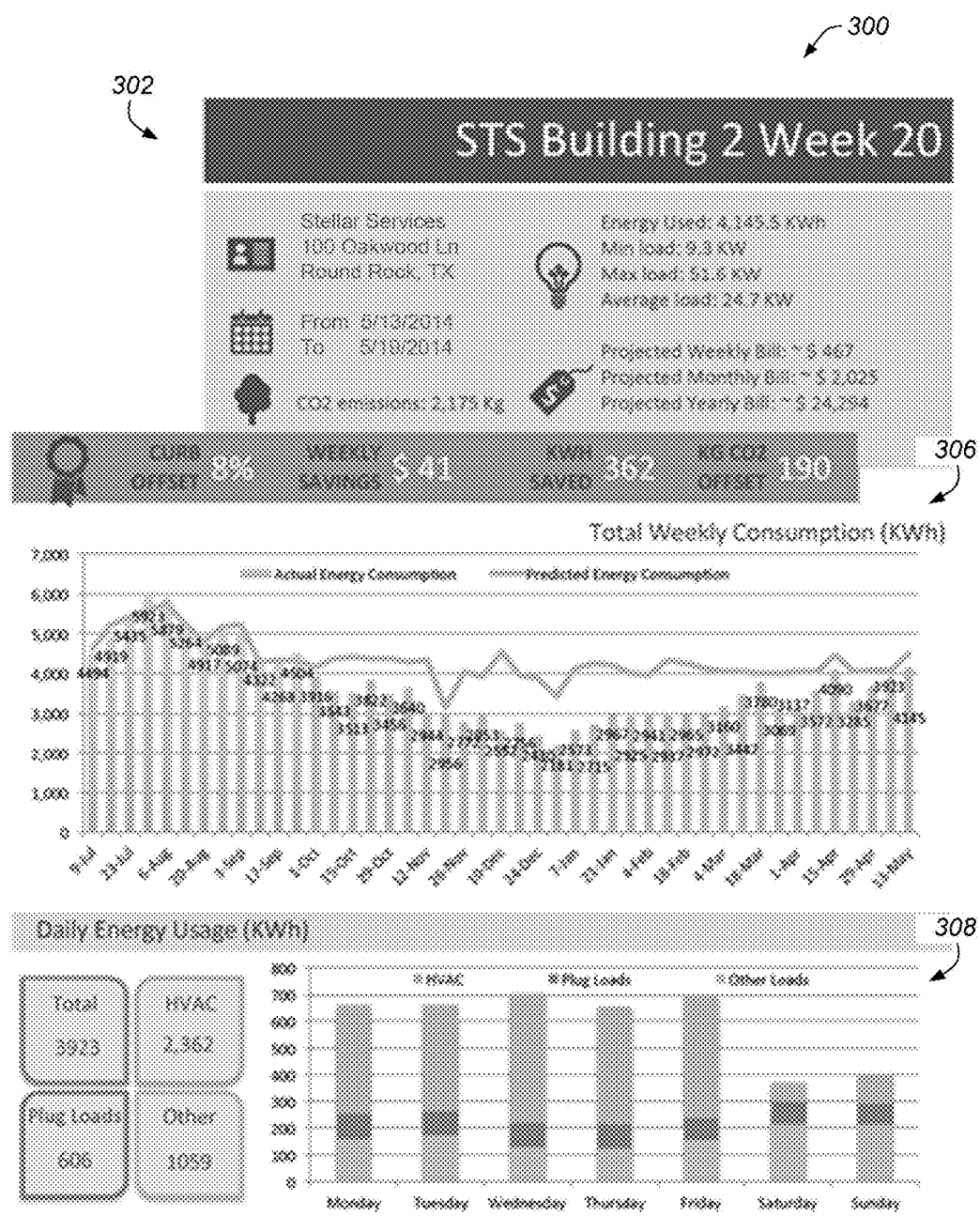
FIG. 7 illustrates one embodiment of a report showing a user's consumption and savings that can be displayed on a user device.

FIG. 7 illustrates one embodiment of a report showing a user's consumption and savings that can be displayed on a user device. Report display 300 includes summary panel 302, savings summary 304, weekly consumption graph 306, and consumption breakdown panel 308. Consumption breakdown panel 308 provides a breakdown based on different kinds types of loads, such as HVAC, plug loads, and other loads.

Figure 8:
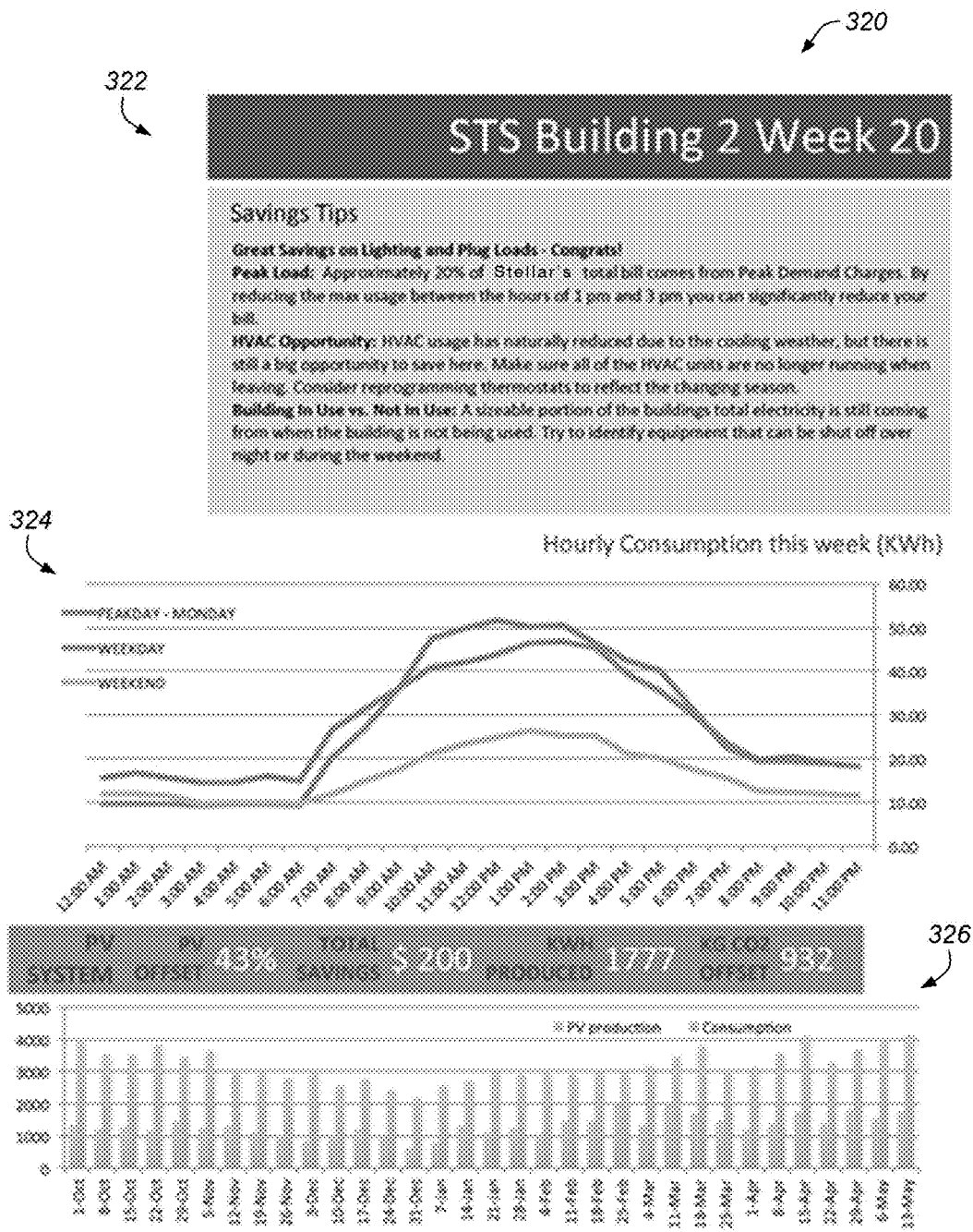
FIG. 8 illustrates one embodiment of a second report of a user's consumption and savings that can be displayed on a user device.

FIG. 8 illustrates one embodiment of a second report of a user's consumption and savings that can be displayed on a user device. Report display 320 includes savings tips panel 322, daily profile 324, and solar production summary panel 326. Daily profile 324 includes a graph showing lines for workday, weekend, and the day where the peak load occurred. Solar production summary panel 326 may graph solar production (for example, from photovoltaic cells) compared to the total consumption since the system was installed at a facility.

Figure 9:
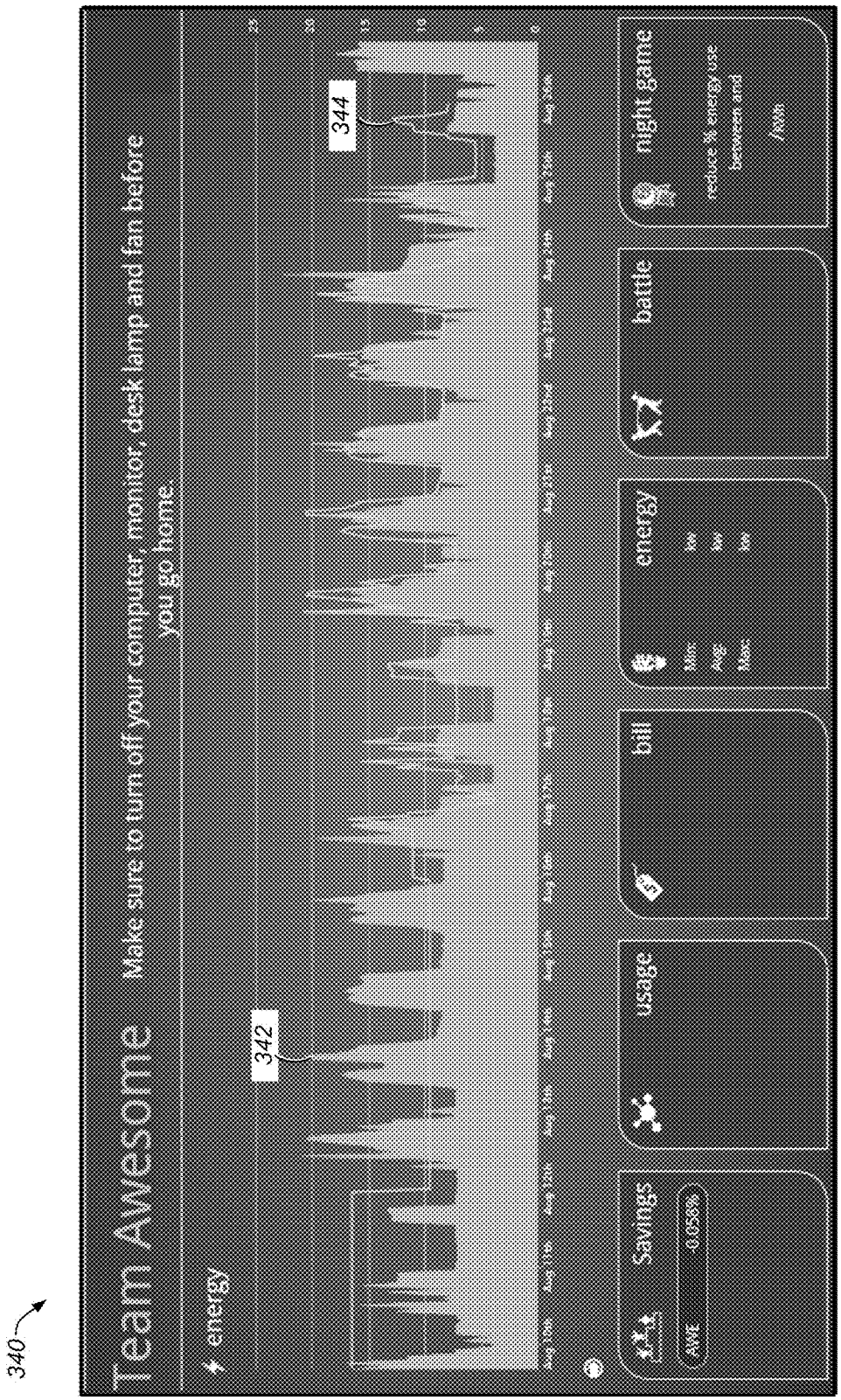
FIG. 9 illustrates a display of a historical view for resource consumption by a user.

FIG. 9 illustrates a display of a historical view for resource consumption by a user. Historical view 340 includes graph 342. The graph may show all dates of the viewer's energy consumption. Consumption may be shown based on monthly, daily, hourly or minute intervals. The user has the ability to zoom in on any specific date in time (for example, by clicking and dragging the cursor). Plot 344 shows the actual resource consumption. Using this mechanism, the user can identify dates or times when more or less energy has been used. Line 346, plotted on top of the data, may indicate the projected baseline. The baseline m allows the user to see what the user's expected energy consumption is for a particular time frame.

Figure 10:
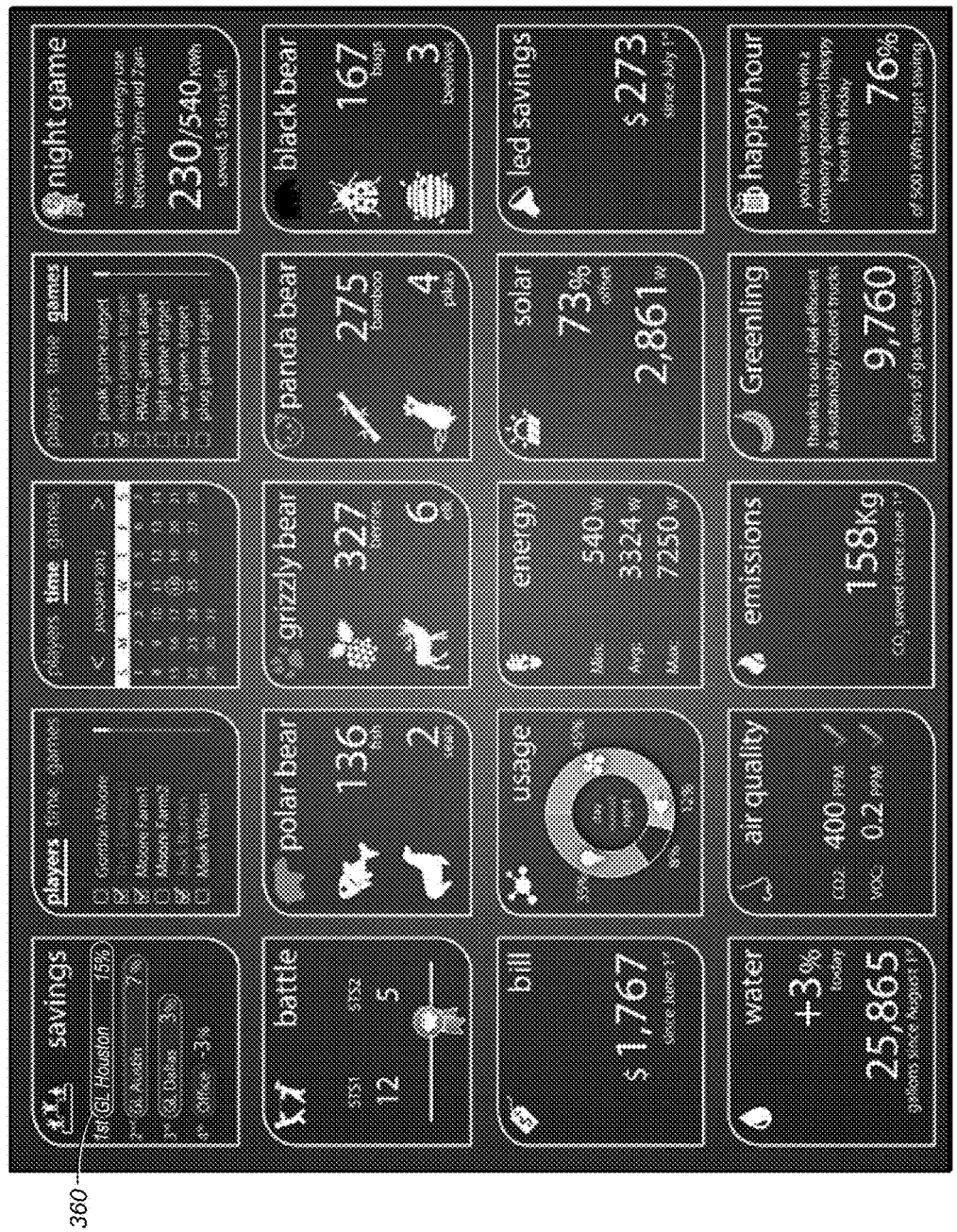
FIG. 10 illustrates one embodiment of a set of widgets for a power consumption display.

In some embodiments, a graphical display for providing information about consumption of a resource includes a user-selected set of widgets. FIG. 10 illustrates one embodiment of a set of widgets for a power consumption display. Each selected widget may display different information to the user. Widgets 360 may be selected and arranged by a user. In some embodiments, widgets may allow a user to establish characteristic for a completion between other resource consumers. A menu or selectable list be provided to take input from a user to select competitors for a game, a type of game, a date or date range for a game, or other characteristics of a competition. In some embodiments, a widget provides results or user performance information, such as amount of energy saved, amount of energy offset by solar production.

Figure 11A:
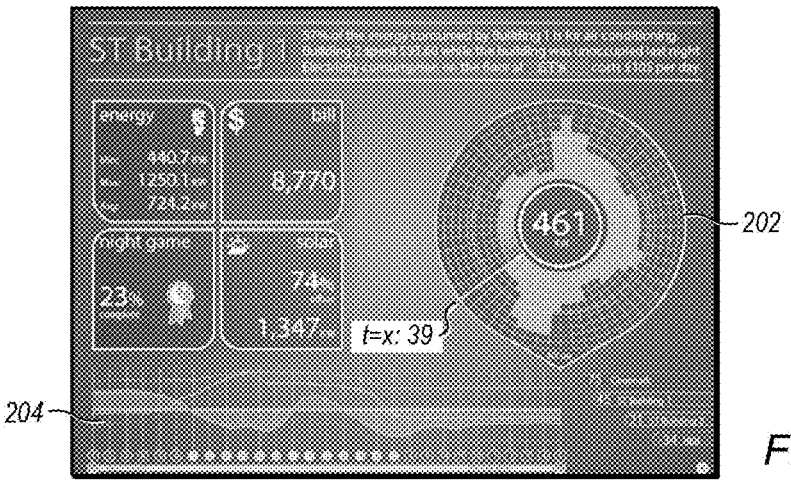
FIGS. 11A through 11C illustrate a radial graph display at different times.
Figure 11B:
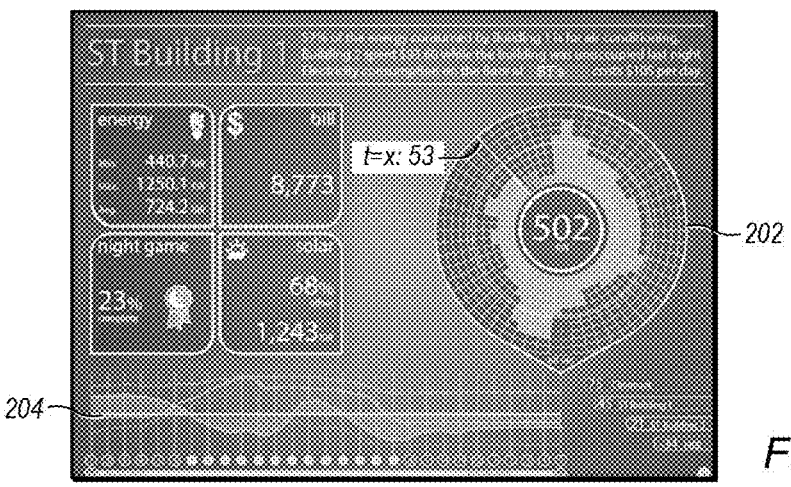
Figure 11C:
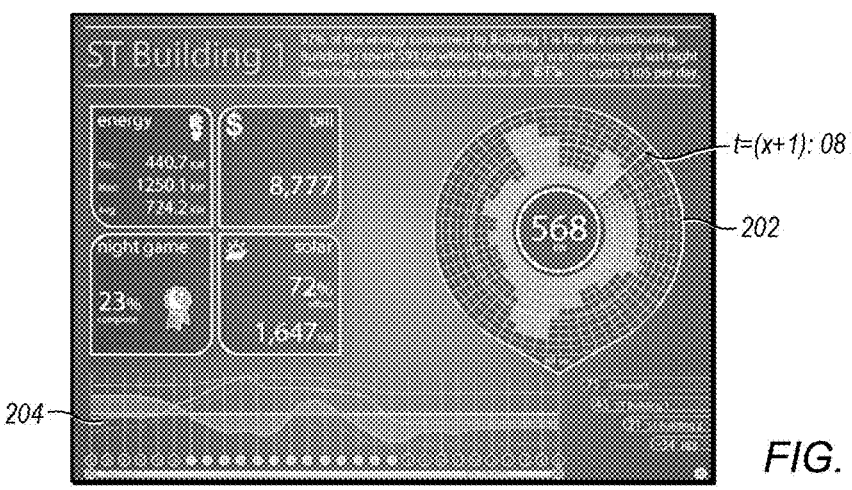

A radial graph may display power consumption information in real time. During operation, the graph is continually fed in 1 second intervals. Every time a second goes by, the total power draw from the interface is updated. In order to highlight which time segment is being updated, there may be a fading effect some segments ahead of the current one. For example, in one embodiment, the fading effect is applied to next 5 segments that ahead of the current consumption indicator. FIGS. 11A through 11C illustrate a radial graph display at different times over a 29-second period. FIG. 14A is at time=x:39. FIG. 11B is at x:53, a point in time 14 seconds after the time of FIG. 11A. FIG. 11C is at (x+1):08, a point in time 15 seconds after the time of FIG. 11B.

In some embodiments, a system displays an indicator that has one or more characteristics analogous to a physiological indicator. The physiological indicator may represent resource consumption by the user. In one embodiment, the display includes an indicator that pulses like a heartbeat.

In some cases, a display includes one or more energy consumption indicators that are suggestive of physiological indicator. In one system, for example, a circle or ring on the display flashes on and off as a "pulse rate" suggestive of a heartbeat. A higher pulse rate indicates a high level of energy consumption, while a lower pulse rate indicates a lower level of energy consumption.

Figure 12A:
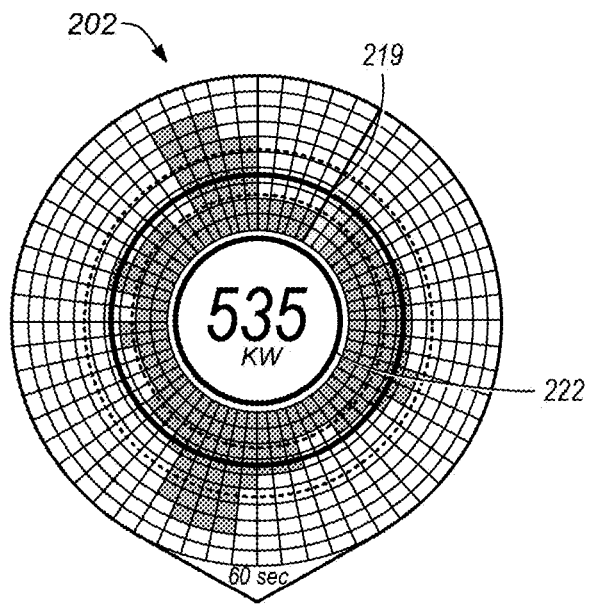
FIGS. 12A and 12B illustrate a display including a heartbeat visual indicator in a radial graph of power consumption.
Figure 12B:
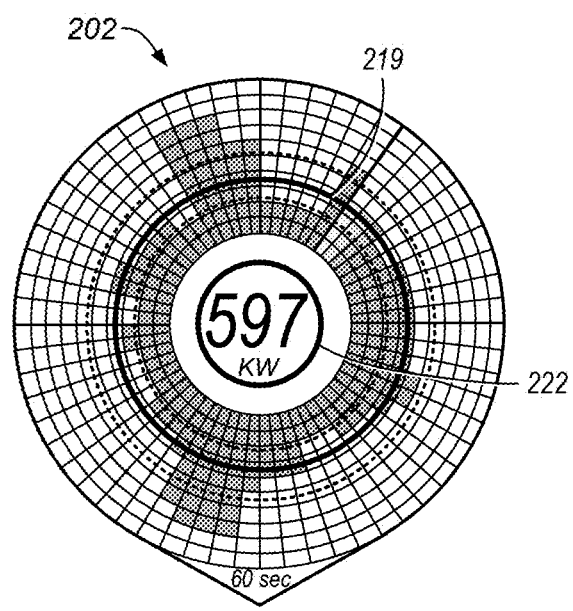

FIGS. 12A and 12B illustrate a display including a heartbeat visual indicator in a radial graph of power consumption. Heartbeat ring 222 is included at the center of radial graph 202. Heartbeat ring 222 pulses such that the ring dilates and contracts on the display at a rate similar to that of a human pulse. For example, at time=x:05, the ring may be at a dilated state as shown in FIG. 12A, while one second later at time=x:06, heartbeat ring 222 may be at a contracted state as shown in FIG. 12B. The rate of pulsing of heartbeat ring 222 may correspond to a rate of consumption by the user. As consumption increases, the pulse rate increases in manner suggestive of a heart under stress (for example, while exercising). As consumption decreases, the pulse rate may decrease to a rate suggestive of the heart rate of a person at rest. In this manner, the view of the display may present a continuous indicator of whether the user's consumption is at a relatively high level, moderate level, or a relatively low level. The pulse rate may also change based on the normalized consumption such that high pulse rates only occur when the energy consumption is much higher than the typical energy consumption at that time. (For example a high pulse would result from light being left on in the middle of the night). The actual energy consumption may be low but it is much higher than the typical energy consumption at that time period. Examples of other physiological indicators include shivering, wheezing, or breathing intensity. Units of energy (kWh) or power (kW) in the display are not typically well understood by most individuals. Additionally, the absolute values of these factors are not typically reviewed so there is little reference to know if a particular power consumption is high or low. By using physiological display methods, an untrained user may be able to intuitively understand if the building is using too much energy (typically illustrating waste) and may thus be more motivated and have information to correct the situation.

As noted above, the display may include information about other users' power consumption in addition to the user.

In some embodiments, an administrator page allows input an hourly normalized score for each competitor. Different profiles (in office/out of office) may be automatically selected based on administrator-selected criteria, such as the day of the week. For example, different profiles may be provided for weekends and week days. The System Administrator page may allow user to select profile for different days in advance or set a weekly or monthly or yearly patterns.

In some embodiments, a system gathers and displays information about use of an energy-consuming resource, such as an air-conditioning system, to a user of the resource, while the resource is being used, based on one or more benchmarks determined by the system. In some cases, information is displayed to the user in real-time. The user of a resource may be an individual or a group of individuals (for example, all of the occupants or a home or office building). Users may be motivated to reduce energy consumption based on the information displayed.

In some cases, a residential user's consumption level may be compared to one or more other residential users. For comparison purposes, each user's consumption may be normalized based on each user's past consumption, weather, building size, number of occupants, and age of construction. For example, each residential user's consumption may be normalized based on what that user was consuming during some previous time period (for example, a one-hour time period 24 hours ago, or 7 days ago).

In some embodiments, a system gathers and displays information about use of an energy-consuming resource, such as an air-conditioning system, by one or more users of the resource. The information provided to the system is analyzed. Patterns may be identified for particular users. Based on the information gathered and learning by the system, each user may be presented with suggestions on how to reduce energy consumption. A user may also be assigned goals or targets for reducing consumption.

In some embodiments, a user is presented with a display showing a comparison of the user's goals with actual consumption. In one embodiment, a user display includes a line graph showing a plot of the user goal versus actual consumption as a function of time. The differences between goal and actual consumption may be highlighted. For example, if the user is outperforming the goal, the period of outperformance (e.g., above the baseline) may appear shaded in green on the graph, while a period of underperformance (e.g., below the baseline) may be shaded in red on the graph.

In some cases, the system identifies and tracks specific devices/systems based on load signatures. For example, based on characteristics of the load when the unit is switched on, the system may identify that a particular type of airconditioning unit is being operated. Goals or recommendations may be tailored using the information about how and when particular devices/systems are being used. Recommendations may also be displayed based upon the level of success achieve from previous recommendations. In some embodiments, a system performs predictive analysis based on collected energy use data.

In some embodiments, one or more baselines are established for a user. The baseline may be used to identify where there are opportunities for reduced wasted resource consumption. Examples of factors and systems that may provide opportunities for reduced consumption include unoccupied building loads, HVAC, and lighting. The system may automatically identify opportunities.

In certain embodiments, a system compares a hypothetical perfect building to particular building and identifies waste within different processes and mismanagement. Historical usage may be reviewed to identify trends or anomalies within a particular entity's consumption as compared to its competitors.

In some embodiments, a baseline is established by assessing optimum or minimum usage for a place based on selected past measurements of consumption in the place. To establish the baseline, an interval of interest, such as 24 hours, may be selected. Data for a historical period, such as consumption over the last year, may be analyzed to identify optimum or minimum energy usage. For example, minimal usage points may occur at certain times of day, when no one is in the building. Minimum values may be used to establish a baseline value. The baseline values may provide a user with an indication of how well the user could be doing in its level of consumption. The system may update the baseline based on learning from additional minimum data points as the system operates.

In some embodiments, triggers are established based on specific electrical signatures of components or systems in a place where consumption is being monitored. An electrical signature may be based on, for example, electrical load characteristics of power consuming system, such as an HVAC system. A notification may be displayed to a user when a specific load at the user's location is switched on or off.

An event ticker may be used to distinguish and highlight events that have a large effect on the energy usage. For example, turning on a set of lights may register an increase of 500 watts, the event ticker would read "Bay Lights On". The ability to determine the increment amount (i.e. 1 W, 5 W, 20 W, or 500 W) may be dynamic. The label that is attached to them may be configurable.

A value related to the threshold change in power may be configurable within the administrative settings so that only changes of a specific magnitude trigger a ticker event. For example, with a trigger of 300 W, a 100 W change might not trigger any events tickers, but a change of 500 W would trigger the review of table and the event "bay lights on/off".

During the on-site configuration of a particular entity, an initial table of Events and Values may be developed. The table should have the ability to be updated remotely as greater insight into the energy consumption become available. Table 1 shows an example input structure.

TABLE 1

| Example of Configuration Events for Ticker | | | | | |
|---|---|---|---|---|---|
| Change | Tolerance | Time Period | Tolerance | Event | Color |
| 500 | 10 | 1 | 0.5 | Bay Lights | Yellow |
| 3 | 1 | 5 | 2 | AC Fan | Yellow |
| 800 | 200 | 1 | 0.5 | Compressor | Orange |

Each input may have its own Event Table with X rows for specific events. If two events have very similar load signal or "value", a physical reconfiguration of the monitoring device may be necessary to break the two different events into different inputs.

In some embodiments, the operating settings for the resource may be determined by an algorithm based on the combined input of the users in the group (rather than, for example, the noisiest member of the group). Patterns of each user may be tracked, and a user's changes attributed to total energy consumption (for example, the user's contribution to the energy bill). Users may be provided with feedback to promote reduced energy consumption. In some cases, a user is presented with options to offset the user's energy usage with energy-saving measures, such as turning off the user's lights or printers. In certain embodiments, the system may provide suggestions on an action to offset the effect of the user's choices.

In many embodiments described above, information is related to energy consumption. A system may nevertheless, in various embodiments, incentivize any behavior. Examples of objectives that may be promoted using games or user comparison displays such as described herein include ecological footprint, green initiatives, cultural improvements, environmental quality, and marketing. Additionally, objectives can be surrounding improved health for building occupants by changing air circulation patterns or changing the air chemistry, composition, or filtration levels.

In one embodiment, a system presents the owner of a home with information comparing environmental quality. Characteristics of the facility that may be monitored, compared and reported include natural light, indoor air quality, carbon dioxide levels, VOCs, acoustics, and thermal comfort. Promoting or optimizing environmental quality characteristics may be included in a game between occupants of different places. For example, the occupants of one building on a company campus may compete with occupants of other buildings to reduce carbon dioxide levels. Each building may be provided with sensors, instrumentation, and monitoring devices (for example, carbon dioxide sensors, acoustic meters) to supply data about conditions in the home.

In some embodiments, a score associated with ecological impact or environmental impact is determined for an entity, place, or both. The score may be a composite score based on multiple factors. For example, the system may compute an environmental score for occupants of a building that is based on a composite of values for each of air, water, gas, energy, light quality, or a combination of two or more such factors.

Home Intelligence System with Disaggregation and Device-Specific Notification

Figure 13:
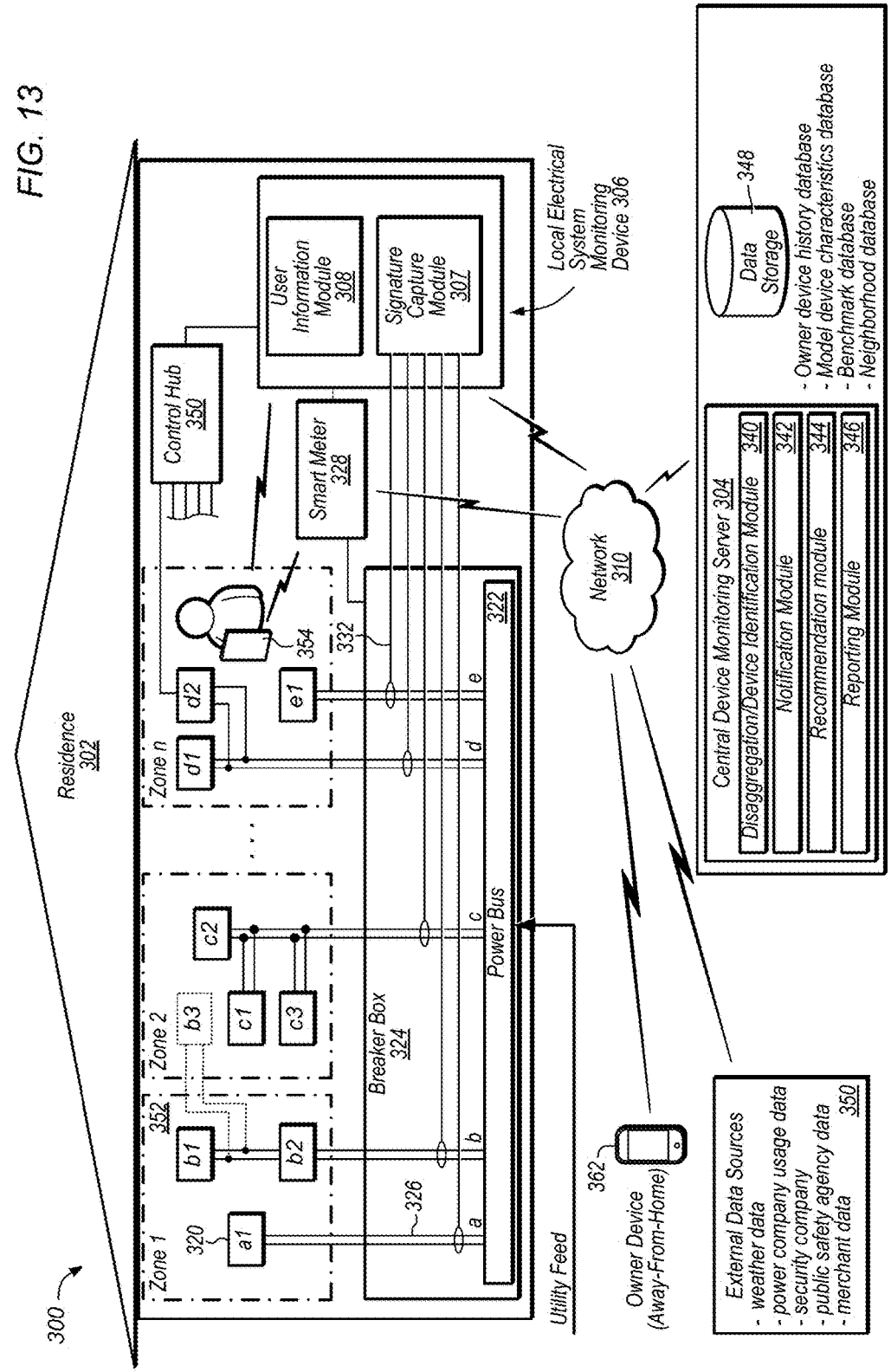
FIG. 13 illustrates an embodiment of a home intelligence system including a local signature capture device.

FIG. 13 illustrates an embodiment of a home intelligence system that includes a local device that captures energy consumption as well as electrical signature data such as: phase angle, voltage, current, frequency modes, amplitudes, and all other digital and analog characteristics related to the electrical signature of the devices within the home. The local electrical system monitoring device is connected, via a network, to a remote server that further processes and uses information acquired by the signature capture device. In some embodiments, the remote server is provided through cloud computing services, in other embodiments all of the process is completed locally.

Home intelligence system 300 can provide information to a homeowner of residence 302. Home intelligence system 300 includes central device monitoring server 304 and local electrical system monitoring device 306. Local electrical system monitoring device 306 includes electrical signature capture module 307 and user information module 308. Central device monitoring server 304 is connected to local electrical system monitoring device 306 over network 310. Network 310 can be any communication channel including all wireless and wired channels used in the communication of data. Central device monitoring server 304 may be at a location remote from residence 302. Electrical signature capture module 307 captures signal information from power lines in residence 302, which can be used to determine electrical signatures for electrical devices in residence 302. Local electrical system monitoring device 306 may exchange information with electrical devices operated by a homeowner or other resident. Such electrical devices may include, in various embodiments, a desktop PC, a tablet computer, phone, smart television, or a dedicated energy consumption display portal device.

Local user information module 308 may determine information to be displayed to, and receive input from, homeowners, residents, or other occupants of residence 302. Information generated for a user may include power consumption information and other information about electrical devices, which may be on a zone-by-zone and/or device-by-device level, notifications about electrical device conditions, and recommendations. In some embodiments, local user information module 308 manages control signals for specific electrical devices from residents, the homeowner, central device monitoring server 304, or other external components.

For illustrative purposes, only one residence is shown in FIG. 13. A central device monitoring server may, however, be connected to, and provide external data computations, analysis, monitoring, and reporting for, any number of residences. In some embodiments, a central device monitoring server 304 provides monitoring for numerous members or subscribers in a neighborhood, city, or other area.

Electrical devices 320 may be distributed through various locations in residence 302. Power bus 322 in breaker box 324 may receive power from a utility feed and distribute the power to various ones of electrical devices 320. Each device 320 may receive power by way of one of circuits 326. Electrical devices 320 may be one of various electrical devices in or at a residence, including a refrigerator, dryer, lamp, plug load, stove, pool pump, porch light, or other device. In FIG. 13, for illustrative purposes, power is supplied to electrical devices 320 by way of one circuits a, b, c, d, or e. Each of circuits 320 may correspond to one circuit breaker in breaker box 324.

Smart meter 328 may monitor power distribution to some or all of electrical devices 320 Smart meter 328 is linked via a network to central device monitoring server 304.

For illustrative purposes, five circuits (a, b, c, d, and e) are shown in FIG. 13. A home intelligence system may, however, measure electrical signals on any number of circuits (1 to n circuits). In certain embodiments, a home intelligence system may be connected to power distribution components in more than one location (for example, breaker boxes in each of two different locations in a home).

Electrical signature capture module 307 may include a control module to turn circuit breakers on and off and a power sensor array 332. Power sensor array 332 may include a sensing device for each of circuits 326. The sensor may be, in one embodiment, current transformer (CT) loops or Rogowski coils. The CT may be coupled to conductors for each of the corresponding circuits. In various embodiments, power sensor array 332 may sense current, voltage, and/or other characteristics of power being distributed to electrical devices 320. Signature capture device 308 may acquire signals from conductors in power circuits 326 and perform some or all processing of the signals for determining electrical signatures for some or all of electrical devices 320.

In one embodiment, electrical signature capture module 307 may convert signals from power sensor arrays 332 from analog to digital data. As further described below, signature capture device 308 may perform signal processing of the digital data, such as a Fourier transform. Local electrical system monitoring device 306 may transmit information to central device monitoring server 304. The transmitted information may be a combination of raw signals acquired from power sensor array 332, values computed in signature capture device, or combinations of both.

Central device monitoring server 304 includes disaggregation/device identification module 340, notification module 342, recommendation module 344, reporting module 346, and data storage device 348. Data storage device 348 may include databases used by the central device monitoring server 304 to perform disaggregation, generate notifications and recommendations, and perform other tasks for the home intelligence system 300. Central device monitoring server 304 and all modules (340, 342, 344, 346, and 348) may all reside within the signature capture device or they may reside in another location on the residence premise, or they may reside in a remote location.

Central device monitoring server 304 may access information from databases and external information sources over network 310. The accessed information may be used for disaggregation, notifications, and recommendations. Examples of databases that may be accessed from a central device monitoring server include, in various embodiments:

Owner device history database. An owner device history database may include historical data about signals, characteristics, power consumption and performance data of specific devices in a residence. The system may track and analyze trends in use of specific device. The trend data may be used, for example, to assess the likelihood of failure of a given device and, if appropriate, provide a warning to the resident of such failure.

Model device characteristics database. A model device characteristics database may include model signatures or profiles of particular types of devices (e.g., an air conditioner, a pool pump, or dryer, or a television set. The model device characteristics database may be used by the system to determine the type of one of electrical device. This database may be specific to types of devices (resistive, inductive, capacitive, etc. . . . ) or may be specific to the function the devices perform (heating, cooling, lighting, charging, etc. . . . ) in order to help assist the system in determining what kind of device is on/off and the amount of power that it uses.

Benchmark database. A benchmark database may include information on performance or signature characteristics of particular types or models of devices. For example, a benchmark database may provide how much power a particular model of air conditioner typical consumes at a given age and for given set of weather conditions (e.g., temperature, humidity).

Regional database. A regional database may include information about electrical device usage, performance, or characteristics for a defined area, such as a neighborhood, zip code, city, state. The regional database may be used, for example, to generate statistical comparisons between the consumption patterns of a device in one residence versus that of similar devices owned in other residences in the same region. Regional data may be current data or historical data. In certain embodiments, regional data is provided to the system in real-time. For example, the system may generate comparisons of current power consumption by air conditioners in residences in a particular neighborhood.

In some embodiments, central device monitoring server 304 accesses or exchanges information from external sources 350. Data from external sources may include weather data, power company usage data and merchant data (such as specific devices on the marketplace that may benefit the customer). In some embodiments, a central device monitoring server 304 exchanges information with a security company or public safety agency.

In some embodiments, a central device monitoring serve receives data from providers of goods and services. Data from a goods seller may include, for example, information about items that could be purchased from the merchant to replace a component in a residence that has been found to be failed. In some embodiment, the information provided by the merchant includes the terms of promotions or sales offered by the merchant for a replacement product.

Central device monitoring server 304 may use information received from electrical signature capture module 307 to disaggregate devices 320 of residence 302. For example, central device monitoring server 304 may use signals acquired from circuit a to compute an electrical signature for electrical device a1, signals acquired form circuit b to compute electrical signatures for electrical devices b1 and b2, signals acquired from circuit c to compute electrical signatures for electrical device c1, c2, and c2, and so on.

Central device monitoring server 304 may also be configured to identify a type, class, or model of each of devices 320 based on an electrical signature. For example, system 300 may determine that device a1 is a refrigerator is an electric stove, device b1 is a refrigerator and, and device b2 is a coffee machine.

Electrical devices 320 that have been identified by the system may be grouped into zones 352. In some embodiments, each zone may correspond to electrical loads on a particular one of circuits 326.

In some embodiments, each zone corresponds to a particular room of the house. For example, the system may establish a kitchen as one zone, a living room as another zone, and master bedroom as still another zone, and so on. In some cases, one room may correspond to two or more zones, or a zone may cover two or more rooms. In some cases, a zone includes parts of two or more different rooms.

In some embodiments, each zone corresponds to a functional area, for example, the entertainment part in living room, the exercise area in a garage, or the home office in a study. In some embodiments, groups or zones may be established based on functional criteria. For example, one group or zone may be established for all of the entertainment devices, all of the lights, all of refrigerators, all of the exercise equipment, or all of the pool equipment.

In some embodiments, user information module 308 receives notifications generated by central device monitoring server 304 and deliver to an owner device 354 in residence 302. In some embodiments, the owner device is a portable electronic device, such as a tablet computer or mobile phone. The notifications may provide an owner with information about power usage of various electrical devices in the residence, which devices are on/off, warning about failures or potential failures, and anomalous conditions (e.g., a garage door is open when it is not expected to be).

Control hub 352 may be connected to various electrical devices or circuits 320 in residence 302. Control hub 352 may control various ones of electrical devices 320. Control may include actions such as switching a device on or off, adjusting a level on the device (e.g., thermostat setting), or changing a mode of operation. In some embodiments, switching devices are interposed between power receptacle and a plug for the device to be switched the power switch may receive a signal from control hub 352. The switching device may be connected to the control hub 352. Signals from control hub 352 to various electrical devices 320 may be wired, wireless, or combinations thereof.

Owner device 362 may allow an owner to control and/or monitor electrical devices from a location away from the residence. In one embodiment, owner device is a smartphone.

In some embodiments, a control hub receives switching signals for an electrical device in a residence from a remote source. For example, control hub 350 may receive, via user information module 308, an instruction from owner device 362 to turn off a device (for example, an air condition in Zone 2). As another example, control hub 350 may receive, via user information module 308, an instruction from central device monitoring server 304 to turn off a device (for example, an air condition in Zone 2).

Control hub 350 may store and manage a set of conditions that can be set by the user or manager of the system to trigger devices to turn on/off or otherwise change state. One of the conditions that can trigger the control hub is the state (on or off) of any of the devices a1, b1, b2 . . . n#. For example, the control unit could be setup to turn off the porch light of a home when the resident goes to sleep. The control unit knows that the resident has retired to go to sleep because central device monitoring server 304 can tell the state of the bedside lamp in the bedroom. When this bedside lamp turns off between specific (and set) hours, central device monitoring server 304 will alert the control hub 350 that the resident has gone to sleep, and in response turn off the porch lights. In expansion of this concept, in various embodiments, any device within the home can be used as the trigger event for any other event within the home or other system. These events may not be limited to on/off triggers, but may instead be used to trigger notifications to the resident or any other manager.

Although in FIG. 13, control lines are shown as separate from the electrical power lines, in some embodiments, control signal may be sent over the electrical power lines (for example, using power line communications.) In some embodiments, signals are transmitted or received into an electrical system monitoring device (such as from electrical system monitoring device 306 to a power consumption monitor, control hub 350, a modem, or a router) by way of power line communications.

In some embodiments, a resident may be notified by a message provided on a computing device, such as a smart phone, tablet, or desktop computer. In some embodiments, the system provides notifications to a resident or home owner through one or more other mechanisms. For example, the system may provide notifications to a dedicated power monitoring control panel or by way of an audible message made over a loudspeaker system. In certain embodiments, the system provides a notification by operating electrical devices in a signaling manner. For example, if the downstairs lights in a home are on after a certain hour (for example, 1:00 am) and the system detects the upstairs bedroom lights going off, the system may flash the upstairs lights to provide the resident with a visual indication that there are other lights still on in the home.

In some embodiments, a system provides information and controls enabling a homeowner to use information about specific devices being monitored to control those specific devices. For example, the system may use electrical signature data to determine that a television set has is on, and use GPS data from owner device 362 to determine that the owner of the residence is in a remote location. The system may provide a notification to the owner at the remote location that the set television set has been left on. The system may also prompt the owner to shut off the television set which can be accomplished remotely by the users control system.

Is some embodiments, a home intelligence system performs disaggregation of electrical devices by capturing electrical signatures of specific devices in the residence. Specific devices identified may be grouped into two or more zones in the residence. Based on measurements of state of operation, usage and/or power consumption by the specific electrical devices, notifications relating to one or more of the specific devices may be determined and provided to the home owner. Disaggregation may include non-intrusive load monitoring.

For illustrative purposes, disaggregation, power consumption reporting, specific device and zone-related notifications, recommendations, and other functions of the home intelligence system shown in FIG. 13 are distributed among a local device and remote server. A home intelligence system may, however, perform all of its functions entirely locally at a residence (fore example, in electrical power monitoring device 306), or entirely remote from a residence. Various functions of the system may be allocated in a manner other than that shown in FIG. 13. For example, signatures may be computed entirely locally, while notifications and recommendations may be determined remotely.

In some embodiments, a local signature capture device accesses data stored in locations other than a residence by way of a network, and uses the information to determine electrical signatures for one or more electrical devices in a residence. For example, the local device may access model signatures for off-the-shelf components, such as a particular model of television or dishwasher.

Figure 14:
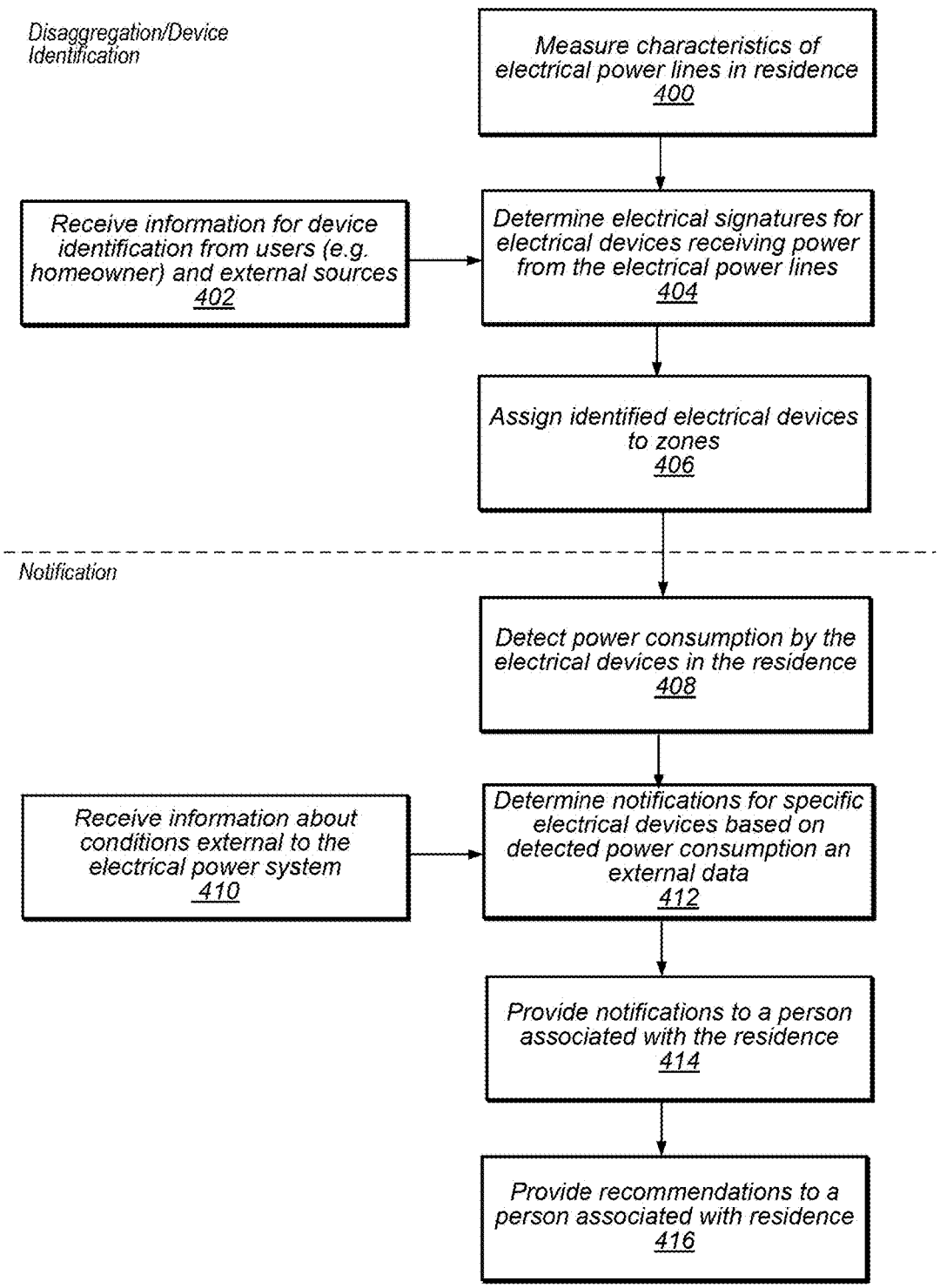
FIG. 14 illustrates disaggregation and device-specific notification according to one embodiment.

FIG. 14 illustrates disaggregation and device-specific notification according to one embodiment. In some embodiments, an initial disaggregation phase is carried out to develop electrical signatures that can be used for monitoring usage in the home and for providing notifications. In this example, at 400, characteristics of electrical power lines in a residence are measured. The characteristics may include, in some embodiments, current and voltage. Specific device identification may be made using combination of (a) user input and (b) a database of parameters that may be internal and/or external to the system.

In some embodiments, information generated using disaggregation is combined with smart meter data. Smart meter data may be integrated with data acquired from specific devices and used, for example, to show savings or correlate with overarching trends in energy usage.

At 402, information for device identification is received from a user (e.g., home owner) and from external sources. Information from a user may include an inventory of electrical devices on each circuit. For example, the home owner may provide a list for each circuit in the residence. The list for one circuit may include a list of kitchen appliances by manufacturer and model number, the list for another circuit may include a list of electrical devices used in a bedroom, and so on. This external source may also be determined via other methods such as a home assessment during installation.

External sources of information that can be provided to a system for use in device identification may include, for example, a database that has electrical signatures for a variety of electrical systems, such as electrical signatures for a particular make and model of a television system, a stove, or a refrigerator. These external sources of information can also be stored locally on the device used for measurement and device identification.

At 404, based on the measured electrical characteristics, an electrical signature for each of the electrical devices may be determined. In some embodiments, each electrical device is associated with an electrical device type (for example, Device 146 is a washer, Device 147 is a dryer, Device 148 is an iron, and so on.) In some embodiments, electrical signatures of specific devices are determined by disaggregation using, for example, a mathematical algorithm. Data processing such as a Fourier transform may be used to in order to move the data from the time domain to the frequency domain. Various other techniques used in the field of digital signal processing may be used to identify specific devices, such as high/low pass filters. Sampling of current and voltage may be carried out at a high frequency (for example, 10 KHz). In one embodiment, the sample frequency is more than twice the highest frequency of the sampled device's electrical signature.

Statistical analysis may be performed on data acquired relating to factors, including current voltage, and phase, time of day, day of week, to determine signatures for specific electrical devices in a residence.

In some embodiments, the system is unsupervised its that it seeks to detect unique patterns without any sort of database or human input. Internally, the system is responsible for extracting these patterns, identifying them in the future, and updating as the pattern drifts. An example of drift would be a refrigerator running slightly longer as the seal degrades.

In some embodiments, human intervention is sometimes used in interpreting the results.

This may be presented to the user as a timestamp and real power (watts). The user can use these to correlate to real world event, like a device turning on, and identify it in the system.

At 406, some or all of the identified electrical devices are assigned to one or more zones. For example, kitchen appliances may be grouped into a Kitchen zone, home ac and heaters may grouped into an heating and cooling zone, and so on.

Once initial disaggregation has been carried out throughout the residence, the system may have information of specific devices throughout the residence, including a list of specific devices with its associated zone and device type. The electrical signature for each specific device is maintained in association with identification information for the device. Disaggregation may continue to be carried out in real-time while the system is used to monitor and manage electrical devices in the residence.

At 408, electrical power may be measured to detect the state of the specific devices in the residence. The state may include whether the specific device is on or off, usage, and/or power consumption of the specific electrical devices. The electrical signatures for each of the electrical device may be used to assess operation of the specific device, including determining when a given device is turned on or turned off, what mode of operation it is in, how much power it is consuming.

Zone-by-zone power consumption information (including, for example, breakdown by zone, comparisons to past usage or power usage of specific individuals) may be reported to a person associated with the residence (for example, the owner of the residence) in real-time. The system may report specifically how much energy each of the residents used over a given period of time based on which devices they used, number of hours they were in the home or which areas of the house they spend the most time.

At 410, the system may receive information about conditions external to the electrical power system. For example, the system may receive weather data, information about the status of the owner, information about the status of systems in a neighboring residence.

At 412, device-specific notifications of events or conditions (e.g., improper setting by the user, abnormal usage, or a device left on, all current states of devices on, off, low, medium, high, device instantaneous power usage, device energy consumption over time period, usage trends of devices by time period) may be determined. The system may implement one or more learning algorithms to identify use by specific devices and assess patterns of use and operation for the specific devices.

Device-specific notifications may be based on combinations of information from the measurements of the electrical power system, external conditions, or combinations thereof. The notifications may include identification of the relevant zone. Such notification may help the user save money, provide additional convenience or improve the safety of the building and residence. An example of helping to save money would be a notification that tells the user which devices are consuming power even when the residents aren't home or using the device, such as a cable box. An example of providing additional convenience is alerting the resident when the laundry has completed so that the clothes don't wrinkle. An example of safety is reminding the resident that a curling iron has been left on for an extended period of time helping to prevent a potential fire hazard.

In some embodiments, a system provides a resident with abnormal use information for particular zones. A push notification may be provided to a resident, for example, if energy consumption in a particular zone is abnormally high or low. Also, the resident may be provided with information that a device has been misconfigured, lights have been left on, a stove has been left on, a timer has been set wrong. For example, the system may send a notification is a pool pump is running for 6 hours in the middle of the night.

In some embodiments, a system uses learning algorithms based on frequency of use, abnormal energy consumption or other criteria. The system may provide a notification based on changes in a pattern of use of device being monitored. If the frequency of actual use of a specific device in a residence does not match a pattern established by previous use recorded by the system, the system may provide a notification based on the change in use.

In some embodiments, the system may account for electrical usage of sub-components of a an electrical system. For example, a system may include electrical signatures that whether particular burners of a stove are on, or whether an electric oven is on, or both simultaneously. In some embodiments, a system distinguishes between different modes of operation of system. For example, the system may distinguish between a ceiling fan operating at a high speed or the same ceiling fan operating at a low speed.

In one embodiment, the system breaks usage down into three categories: variable energy usage, base energy usage, and HVAC usage.

At 414, notifications of event or conditions may be provided to a person associated with the residence (for example, a resident or home owner). In some embodiments, the notification is provided to an owner of the residence. The notifications may by way of a remote device, such as a smartphone. Notifications may be made in real-time.

In some embodiments, using the electrical signatures and the measured of power consumption by specific electrical devices, the system detects or predicts adverse events or conditions associated with the devices (for example, the device is about to fail, the device is wasting energy, or there is a breach of security or safety such as an open garage door or curling iron left on). Device-specific notifications (for example, alerts, warnings) relating to the actual or predicted adverse events or conditions can be provided to an owner using the device-specific electrical signatures.

Examples of notifications that may be provided include actual events or conditions that have occurred, or events and conditions that are at increased likelihood of occurrence. For example, based on patterns of electrical usage, the system may provide a notification that particular appliance or system is likely to fail within a given time period, or is about to fail. In some embodiments, the system provides a notification that usage of a specific device is abnormal. In some embodiments, the system provides a notification that a particular device is consuming an excess amount of energy. In some embodiments, a system provides notifications of how much a customer has spent for a particular device in a given period. The may amount spent information may be provided for custom set intervals. Also, the system may provide a notification if a customer is about to enter a new pricing tier.

In one embodiment, the system provides a user with comparisons power consumption or performance of a specific device relative to similar devices in other residences.

Notifications may be delivered by way of computer display, alarm, or other device. In certain embodiments, a notification is provided by controlling one or more electrical devices in the residence in a pre-defined manner that serves as a warning the occupant. For example, if a problem exists, the system may flicker lights on and off to warn the user of the problem.

In some embodiments, notifications are based on historical data for a specific device that has been acquired by the system. For example, changes in the electrical signature of a device may be used to determine that a particular device is about to fail. In one embodiment, a notification predicting failure of a specific device is based on a combination of historical information for the specific device and weather data.

In some cases, the system uses a combination of external conditions (such as weather data, location data for the owner) and historical patterns previously acquired by the system for a specific device. In some cases, the system implements layered triggers that rely on a combination of two or more factors (for example, time of day+anomalous device usage+owner location). In some embodiments, the system uses the state (on/off, medium, high, low) of many devices in the residence to provide a combination of "if" statements (for example, three or more "if" statements) to automatically determine a notification. As an example, a notification may be sent if the refrigerator door is left open, and if the lights are off in the kitchen and if the TV is off: then flicker the lights on/off.

In some cases, the system uses information about an owner or resident in combination with information about the status of a particular electrical device to determine a notification.

At 416, recommendations are provided to a person associated with the residence. In some embodiments, the system detects the different devices that are on in a residence and how frequently they are used. Based on this usage information, the system may determine suggestions or recommendations. For example, if the resident using his or her oven more often than other people, the system may determine that the resident likes to bake and present advertisements for baking accessories. As another example, if the system detects that the resident has the newest video game consoles and that they are played often, then the system may deliver advertising to the user for a new video game.

In some cases, the system provides recommendations for action that a resident can take relating to an electrical device being monitored (for example, to a recommendation to take an action that would improve energy efficiency). The recommendations may be tailored to a particular user or residence based on measurements of the specific devices in the residence. For example, based on computation performed using data about specific device usage, the system may provide a recommendation to turn up the air conditions two degrees, or to replace insulation.

In some embodiments, the system makes projections on the effect a change in operation of one or more devices in a residence. In some cases, the projections relate to the effect of implementing a recommendation. For example, the system may project to a user that if the thermostat were turned up three degrees (which may be a recommendation), the savings would be $75.

The system also make projections about the effects of adverse conditions or effects. For example, the system may project that energy consumption costs will increase by $8 per month if the air filter of the air conditioning system is not changed.

In some cases, the system provides recommendations for corrective action and/or for replacement or repair of specific devices. Using the electrical signatures and the measurement of power consumption by specific electrical devices, the system detects or predicts failure, malfunctions, or degrading performance of specific electrical devices in the building. The system can combine this information with information about options and sources for purchasing replacement systems/components, repair services, including promotions, sales, or rebates, and present options the owner.

In some embodiments, failure of a system is predicted using a combination of historical data for particular device is correlation with weather data. For example, the system may establish a baseline for how much energy a particular device as a function of outside temperature and humidity. If the actual usage deviates from the baseline, the system may determine that the device that one or more components of the system are breaking down and that the system is more likely to fail.

In some embodiments, a person associated with the residence (e.g., owner of the residence) control electrical devices in the residence based on notifications received from the system. In some embodiments, a system includes controls (e.g., remote power switches) that allow the owner to control the specific electrical devices (turn devices on and off, adjust thermostat) based on the notifications and/or recommendations.

In certain embodiments, a system may use electrical signatures to keep track of a location of an electrical device within a building. The system may keep track of an electrical device being shifted from one zone to another. In some embodiments, the system keeps track of usage of the device in the different zones using the electrical signature determined for the device. For example, the system may determine that a notebook computer is in the kitchen 40% of the time, and in the living room 60% of the time. As another example, in an industrial setting, a system may use electrical signatures to determine that a portable welding machine is used 30% of the time in one shop, and 70% in another shop.

In some embodiments, electrical signatures are acquired in an initial electrical signature determination for specific electrical devices in the residence. In certain embodiments, the system may use these initial electrical signatures for power usage reporting, notifications, and recommendations such as those described herein. The system may nonetheless continue to acquire additional information, and update, refresh, or re-compute electrical signatures (e.g., on a continuous, periodic, or on-demand basis). In some embodiments, electrical signatures for some or all of the specific devices are determined and implemented in real time.

In various embodiments, notifications are made to persons other than a resident. For example, a notification may be made a security company system that an abnormal condition exists, such as a garage door being open when the user is away.

Figure 15A:
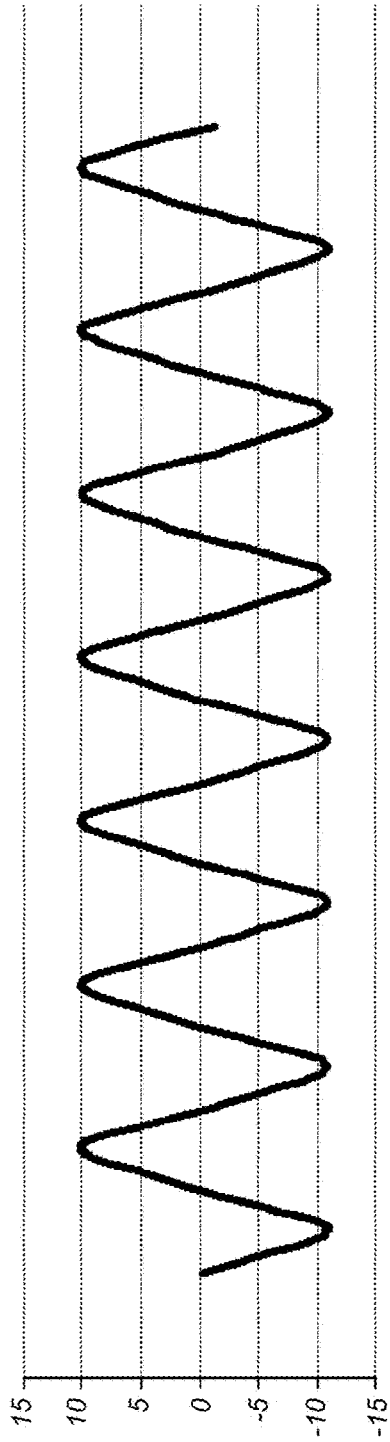
FIG. 15A illustrates one embodiment of a signal produced by measuring electrical power lines supplying power to an air conditioner. 15B illustrates a transformation of the signal for the air conditioner into a frequency domain.
Figure 15B:
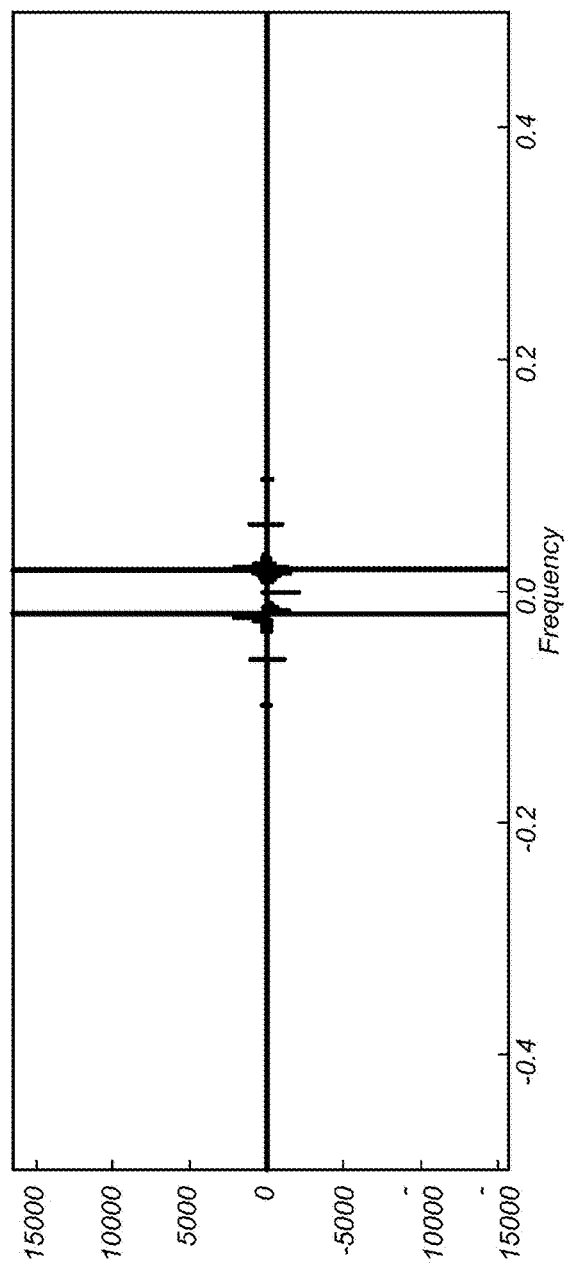

FIG. 15A illustrates one embodiment of a signal produced by measuring electrical power lines supplying power to an air conditioner. The graph shows amplitude versus time. FIG. 15B illustrates a transformation of the signal for the air conditioner into a frequency domain. The graph shows amplitude versus frequency. The characteristics of the signal in the frequency domain may be used by the system to produce an electrical signature for the air conditioner.

Figure 16A:
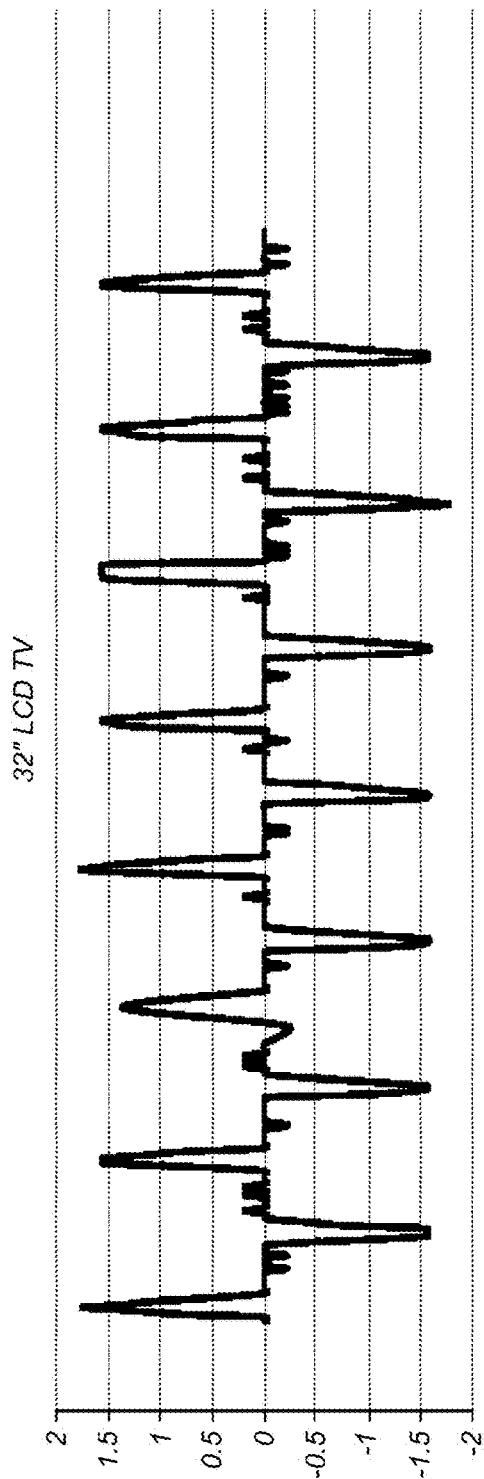
FIG. 16A illustrates one embodiment of a signal produced by measuring electrical power lines supplying power to a 32 inch LCD television.
Figure 16B:
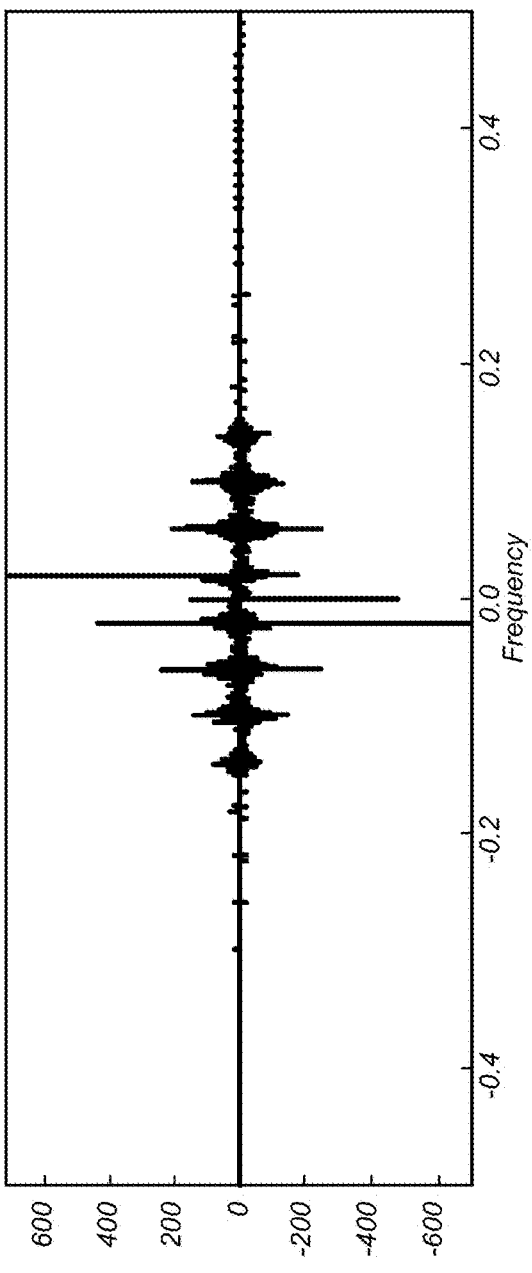
FIG. 16B illustrates a transformation of the signal for the 32 inch LCD television into a frequency domain.

FIG. 16A illustrates one embodiment of a signal produced by measuring electrical power lines supplying power to a 32 inch LCD television. The graph shows amplitude versus time. FIG. 16B illustrates a transformation of the signal for the 32 inch LCD television into a frequency domain. The graph shows amplitude versus frequency. The characteristics of the signal in the frequency domain may be used by the system to produce an electrical signature for the 32 inch LCD television. In this case, the frequency characteristics can be used to by the system to distinguish operation of one electrical device in a residence versus another.

Figure 17:
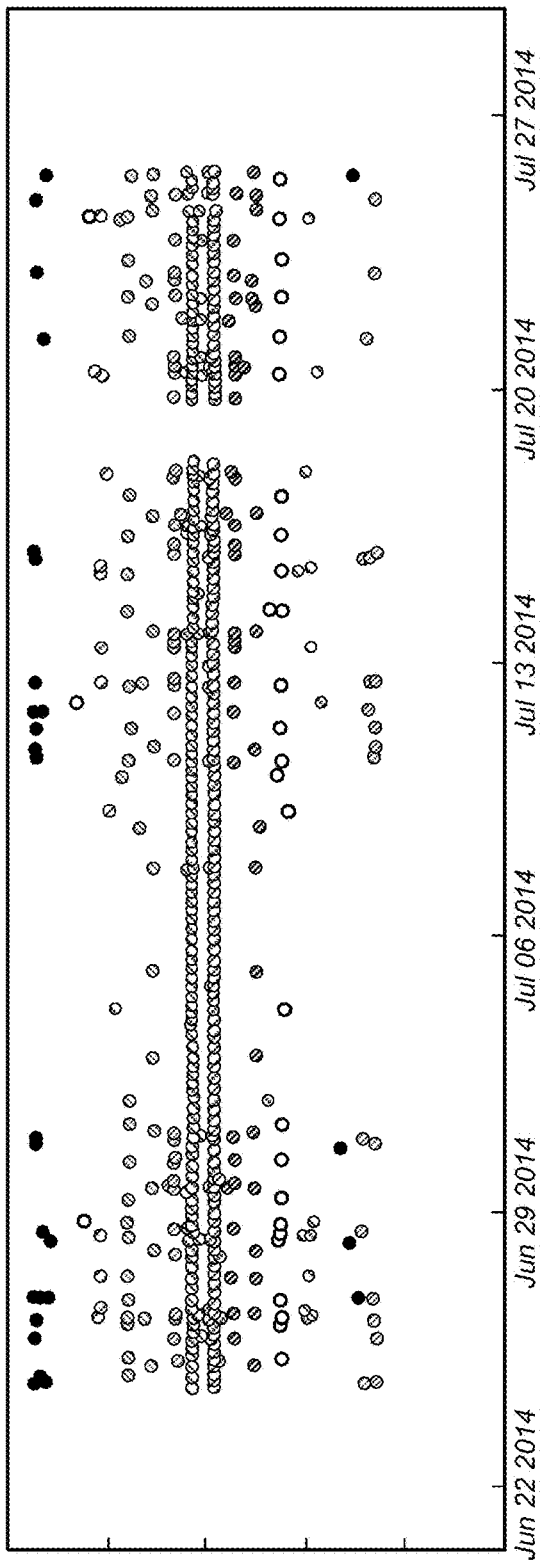
FIG. 17 is a graph illustrating on/off tracking of several electrical devices in a residence.

In some embodiments, the system keeps track of when any of various identified electrical devices are on or off FIG. 17 is a graph illustrating on/off tracking of several electrical devices in a residence. In this case, the graph represents switching of electrical devices in a kitchen over the course of a month. The y axis is the power draw that device uses. Each dot represents the transition of a device, either turning on or off, where the hatching represents the grouping of devices. The on and off transition for a given device may be represented as two separate patterns. In some embodiments, a user may be presented with a graph in which each device is represented by a different color. On and off transition for a given device is represented by two different colors.

Figure 18:
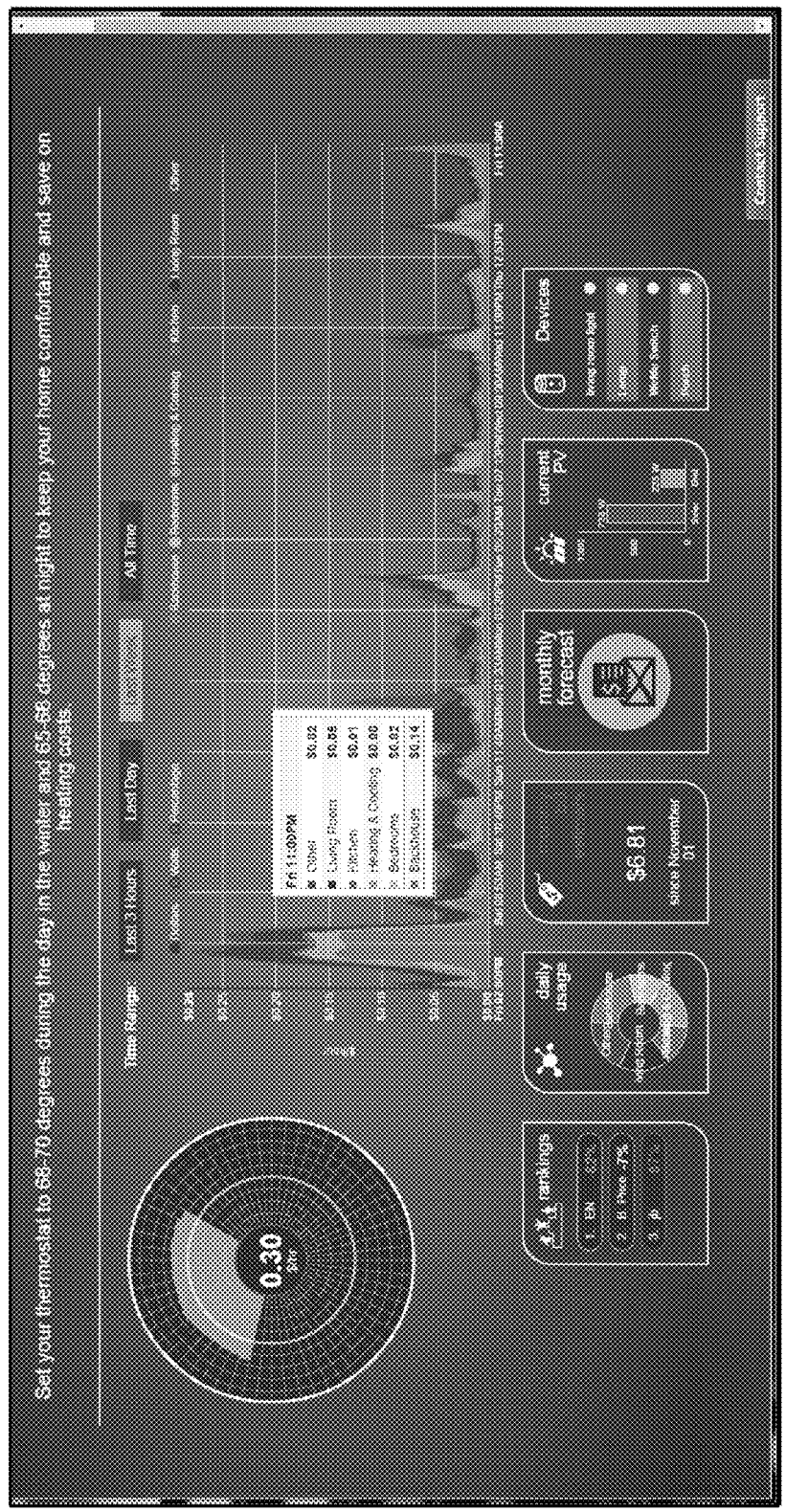
FIG. 18 illustrates one embodiment of a display for providing information about usage of electrical devices in a residence to a home owner, by device and zone.

FIG. 18 illustrates one embodiment of a display for providing information about usage of electrical devices in a residence to a home owner, by device and zone.

Figure 19:
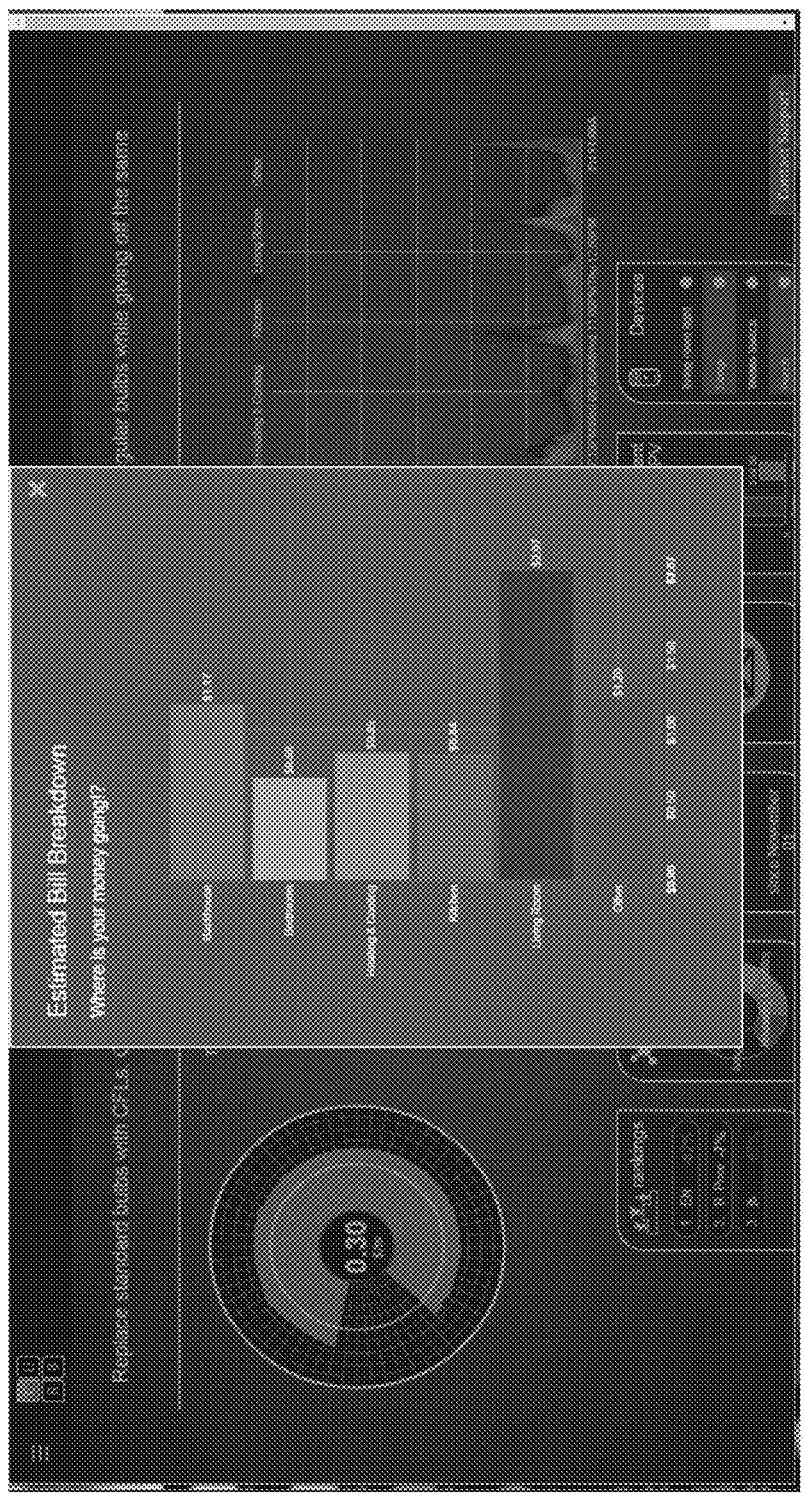
FIG. 19 illustrates one embodiment of a display for providing information about usage of electrical devices in a residence to a home owner, with a breakdown by zone, room, or display.

FIG. 19 illustrates one embodiment of a display for providing information about usage of electrical devices in a residence to a home owner, with a breakdown by zone, room, or display.

Figure 20:
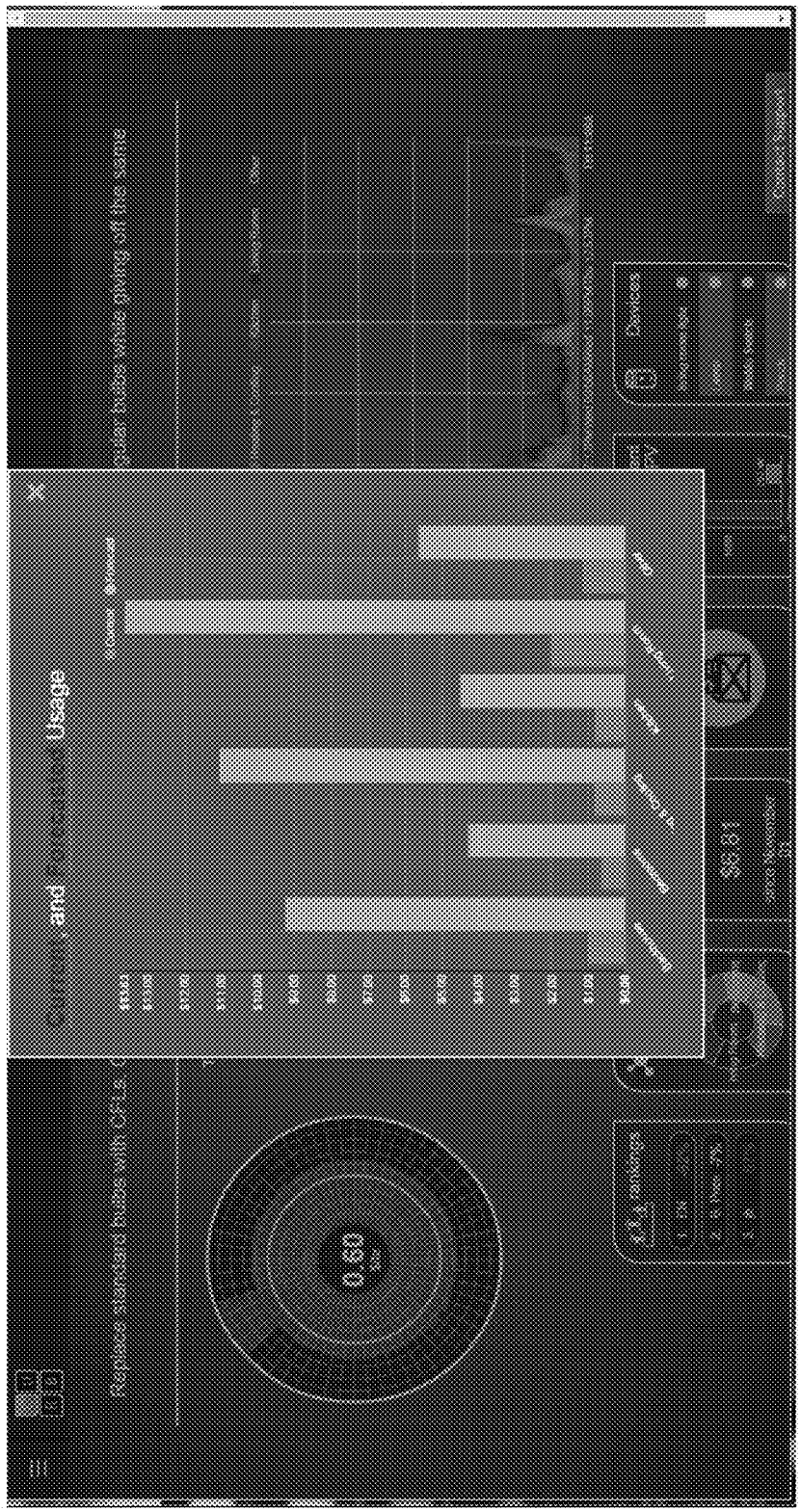
FIG. 20 illustrates one embodiment of a display for providing information about usage of electrical devices in a residence to a home owner, with forecasted usage by room, appliance, and zone.

FIG. 20 illustrates one embodiment of a display for providing information about usage of electrical devices in a residence to a home owner, with forecasted usage by room, appliance, and zone.

Figure 21:
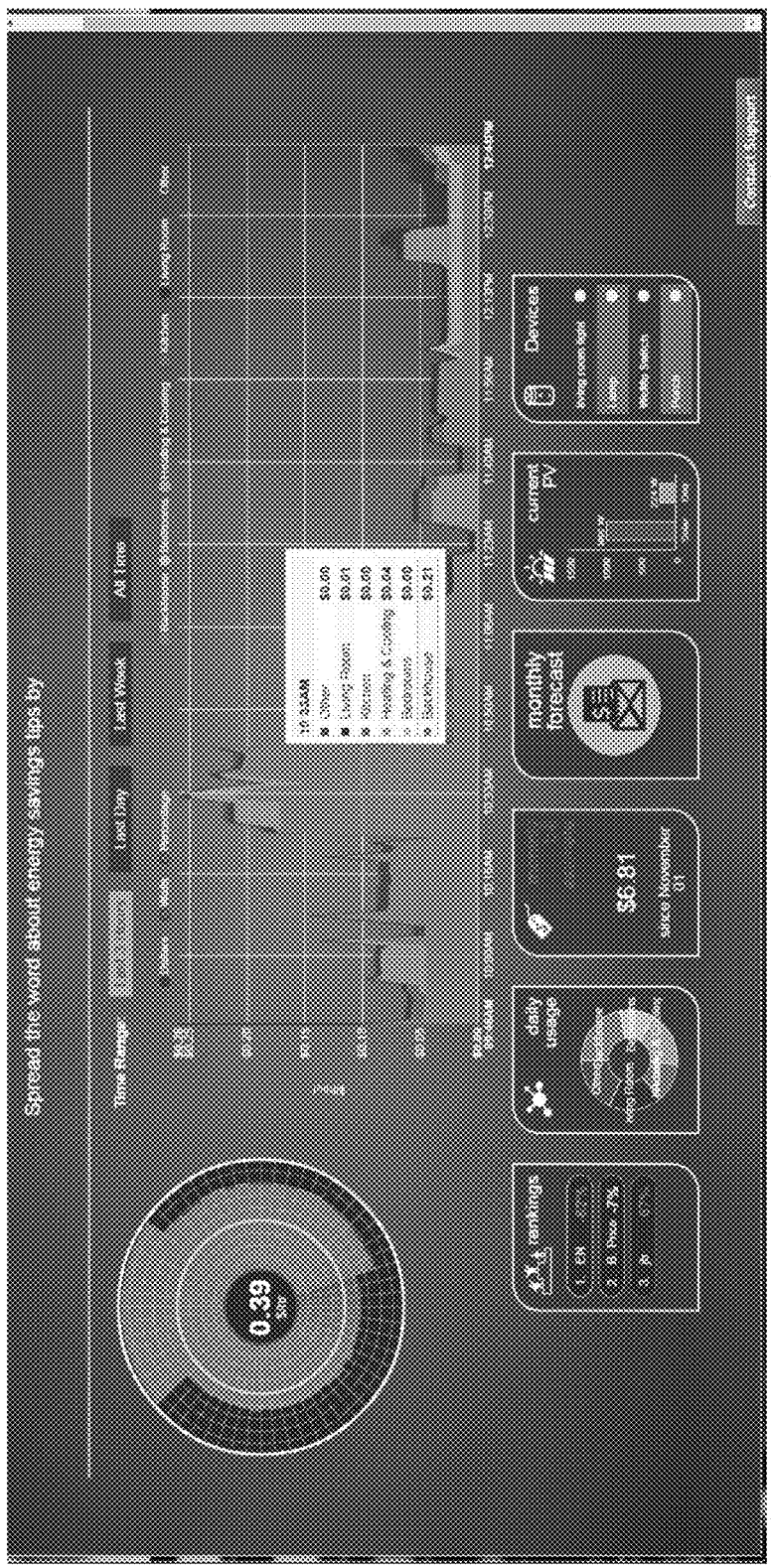
FIG. 21 illustrates one embodiment of a display for providing information about usage of electrical devices in a residence to a home owner, with three-hour peak consumption identification by zone and appliance.

FIG. 21 illustrates one embodiment of a display for providing information about usage of electrical devices in a residence to a home owner, with a three-hour consumption window and identification by zone and appliance.

Figure 22:
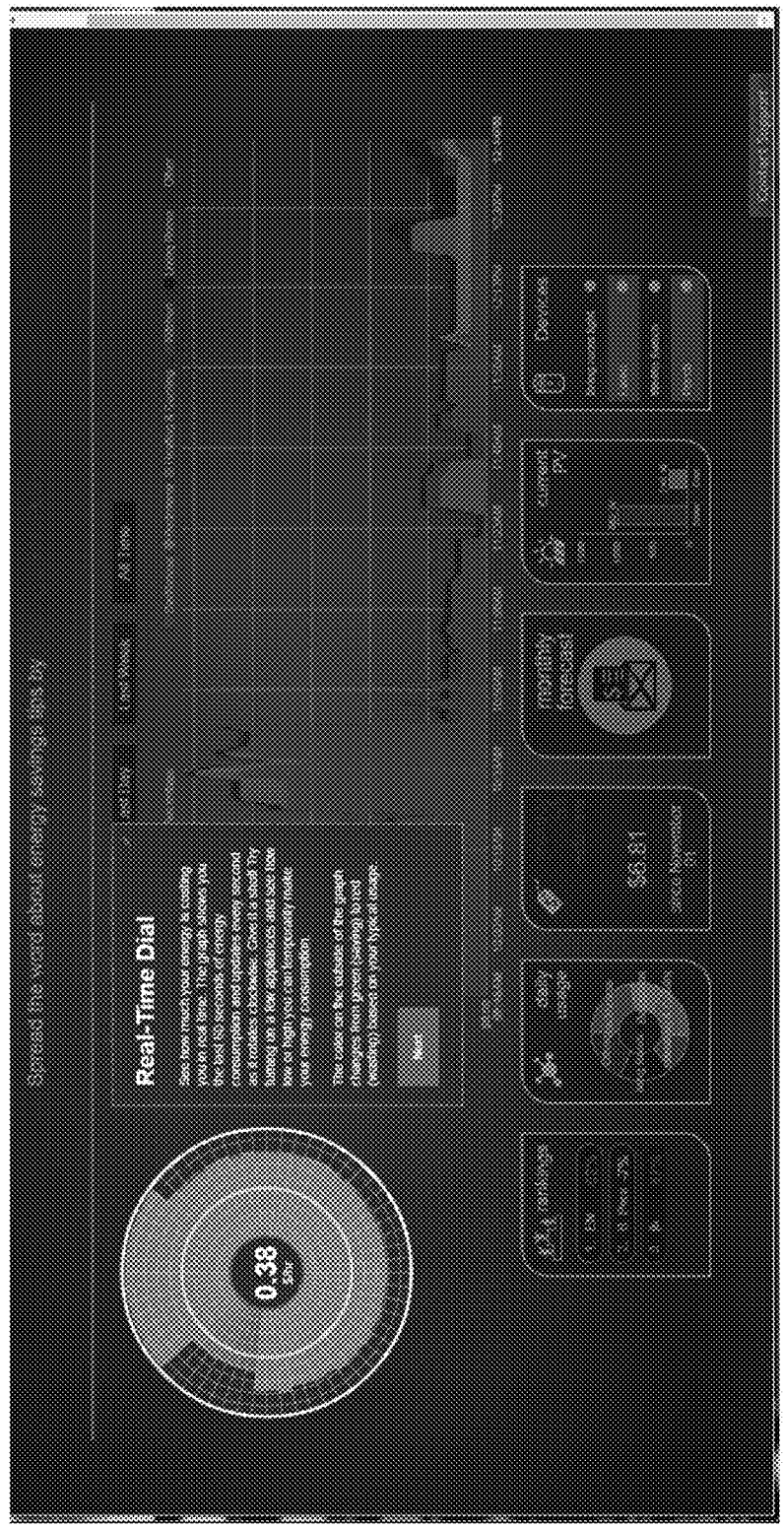
FIG. 22 illustrates one embodiment of a display of a tutorial for a homeowner about usage of electrical devices in a residence. The tutorial guides the homeowner to use the display options to evaluate the effects of using various devices on total energy consumption.

FIG. 22 illustrates one embodiment of a display of a tutorial for a homeowner about usage of electrical devices in a residence. The tutorial guides the homeowner to use the display options to evaluate the effects of using various devices on total energy consumption.

Figure 23:
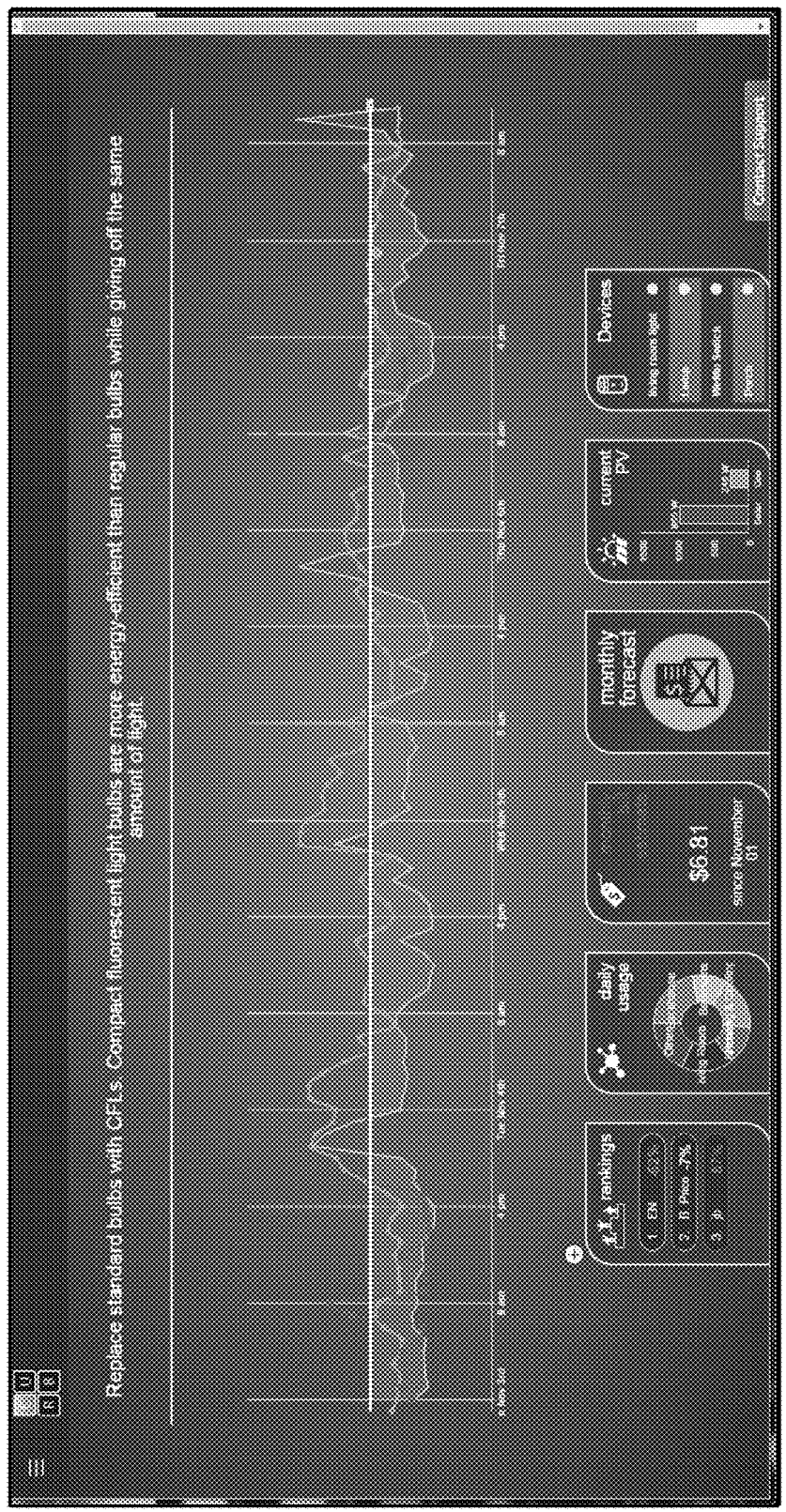
FIG. 23 illustrates one embodiment of a display with a graph showing a comparison of different usage to their typical energy consumption and to each other.

FIG. 23 illustrates one embodiment of a display with a graph showing a comparison of different usage to their typical energy consumption and to each other.

In some embodiments, a signature capture device is installed at a residence or other building to collect information for an electrical power system for use in disaggregation, monitoring, and control of electrical devices in the building. The signature capture device may be coupled to the electrical power lines for various circuits in a home (for example, the power conductors for various circuits in a breaker box). In one embodiment, a signature capture device includes an analog-to-digital converter, a microcontroller and a processor.

A processor of signature capture device may perform transformations (e.g., Fourier transforms and other digital signature processing) and computations of the data received for each circuit. Information that may be used in determining a signature includes voltage, current, and watts, frequency, amplitude, phase angle, power factor.

In some embodiments, information acquired or computed in a local device is sent to the cloud. Devices in the cloud may determine electrical signatures based on the information received, notifications, recommendations, and power consumption information to be provided to residents. In the cloud, information received from the signature capture device may be combined with other information such as power factor, phase angle, weather, time of day, or day of week, to determine electrical signatures for the devices in the various zones in the home.

In some embodiment, a signature capture device provides outputs to send control signals or data over power lines (e.g., using data over power line communications) to the monitored devices. For example, a signal may be sent from the signature capture device to control device coupled to an air conditioning unit or dryer in order to control the on/off state of the device.

Figure 24:
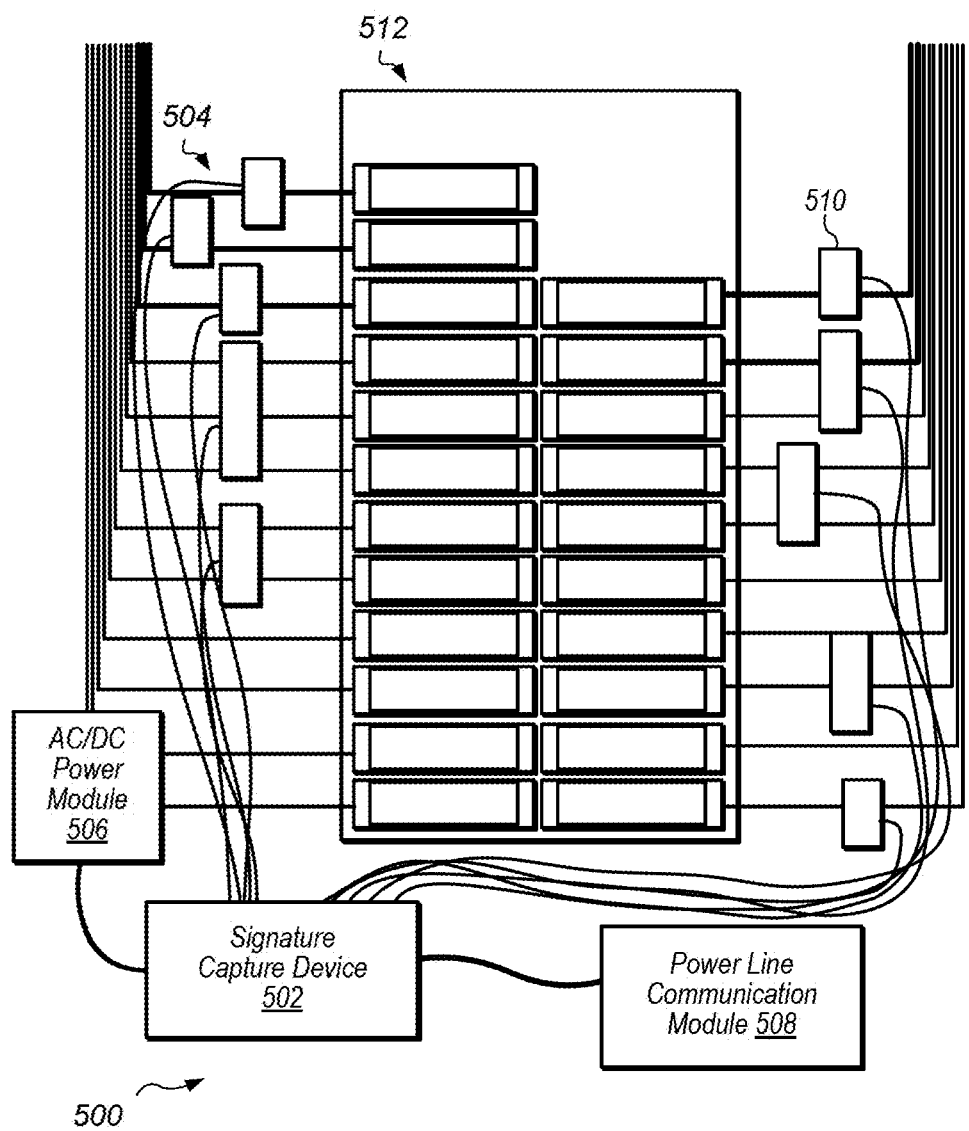
FIG. 24 illustrates one embodiment of a signature capture device installed at the breaker box of a residence.

FIG. 24 illustrates one embodiment of a signature capture device installed at the breaker box of a residence. In this embodiment, the signature capture device may couple to conductors in the breaker box to sense voltage and current.

a) Voltage—Voltage may be measured by a direct connection into the 2 (residential) or 3 (commercial) different voltage phases and allows the signature capture device to measure the voltage, phase angle and power factor. The voltage input also powers the signature capture device (converts to DC current) as well as enables the signature capture device to communicate back to our cloud server—through PLC (power line communication).

b) Current—Current may be measured by placing current sensors around any or all of the wires for which current is to be measured. Any of a variety of types and sizes of current sensors may be used to accomplish this. The sensors may be passive. Examples of current sensors that may be used are: 1) Current Transformers, which contain a solid magnetic, and 2) Rogowski coils, which do not contain magnets. Passive sensors may allow for faster and easier installation.

Signature capture system 500 includes signature capture device 502, current sensor array 504, AC/DC power module 506, and power line communication module 508. Current sensor array 504 includes current sensors 510. Current sensors 510 are coupled at desired locations on the conductors for various circuits in breaker box 512. Current sensors 510 may be in the form of current measurement clamps. Current sensors 510 are electrically connected to signature capture device 502 by wires in current sensor array. The signature capture system 500 may also include connections for sensing voltage in each circuit.

AC/DC power module 506 may couple with one or more conductors in breaker box 512. AC/DC power module 506 may use power from the home to supply electrical power to operate components of signature capture device 502.

Power line communication module 508 may be used to transfer information between signature capture device 502 and external systems. Power line communication module 508 may, for example, enable exchange of information between signature capture device 502 and a remote home intelligence system or a local home intelligence server. Additionally, all other wireless and wired forms of communication may be used to transmit this data.

In certain embodiments, power line communication module 508 enables the signature capture system 500 transmits and receives signals to and from electrical devices in the home. The signals may be used to monitor or control the electrical devices. For example, various lights or appliances in a home may be outfitted with PLC-enabled switches. In response to a notification or a command from a home owner, signature capture device 502 may switch such devices on or off.

Figure 25:
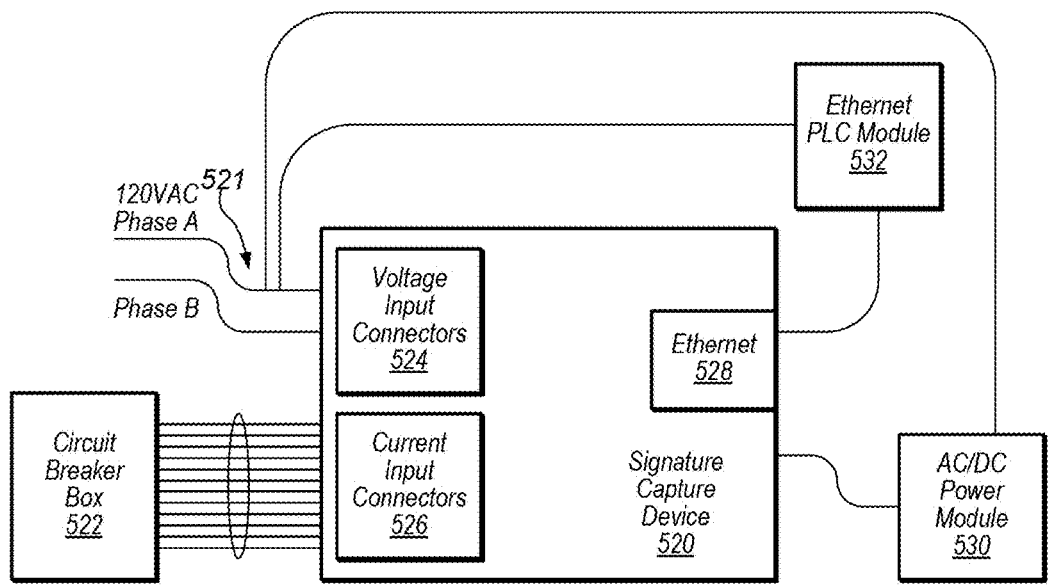
FIG. 25 illustrates one embodiment of input/output for a signature capture system.

FIG. 25 illustrates one embodiment of input/output for a signature capture system. Signature capture device 520 may be coupled to power lines 521 (hot conductors, phases A and B) by way of voltage input connectors 524. In one embodiment, the device includes conductors for receiving signal for up to 18 zones. Signature capture device 520 may be coupled to conductors in circuit breaker box 522 by way of current input connectors 526. Signals and data may be exchanged via Ethernet connection 528, power line communication module 532, or any other wireless process (such as Z-wave, ZigBee, WiFi, BlueTooth, Bluetooth low energy, cellular, etc). AC/DC power module 530 may supply power from the home to components on signature capture device 520. In this example, the system I/O is for two-phase AC. In some embodiments, however, a system may couple with three-phase power, single-phase power, or other types of power.

Figure 26:
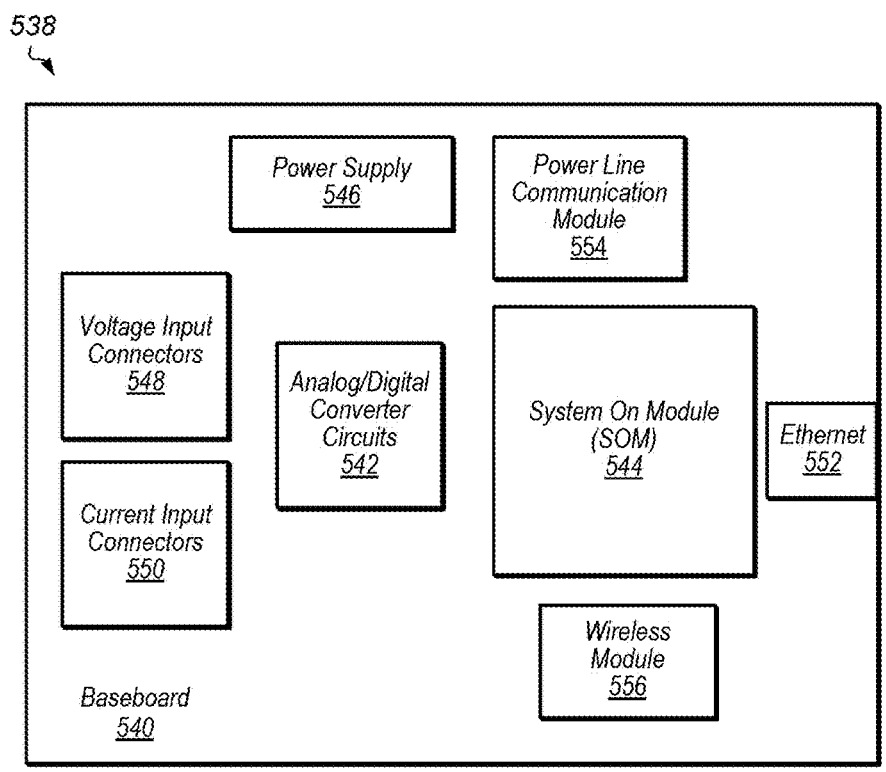
FIG. 26 illustrates one embodiment of an embedded controller board for a signature capture device.

FIG. 26 illustrates one embodiment of an embedded controller board for a signature capture device. Signature capture module 538 includes baseboard 540, analog/digital converter circuits 542, system on module (SOM) 544, and power supply 546. The SOM 544 may include one or more CPUs. Instructions may be provided to the CPU for performing signal processing of signals received from electrical power lines. Analog/digital converter circuits 542 may receive input from electrical power lines in a building by way of voltage input connectors 548 and current input connectors 550. Power supply 546 may supply power to components on baseboard 540.

System on module (SOM) 544 may process digital signals converted from analog signals by analog/digital converter circuits 542. Signals and data may be exchanged with external devices and systems by way of Ethernet connection 552, power line communication module 554, or both. In certain embodiments, signals and data are exchanged by way of wireless module 556. The wireless module may be, for example, ISM band or WiFi.

In some embodiment, a system acquires electrical signatures for devices by measuring characteristics of electrical power lines supplying power to the devices in a facility or building (which may be commercial, industrial, or residential). Using the electrical signatures and the measured of power consumption by specific electrical devices (including historical information for the devices in the facility or building) the system provides information on the actual or predicted contributions of various devices to peak power consumption. The information can be used to reduce peak power, which in turn may reduce utility rates for the facility or building.

In some embodiments, the system detects all of the different devices that are used in a commercial setting and performs an optimization to operation of the factory or business to reduce peak consumption. For example, by offsetting the timing of manufacturing lines and heating processes, a manufacturer may reduce its peak demand. More broadly, if there are numerous different devices that are used throughout a day, the system may produce an optimum profile, with a time of operation for each of the devices, to reduce the peak demand consumption.

Cloud Computing System

Figure 27:
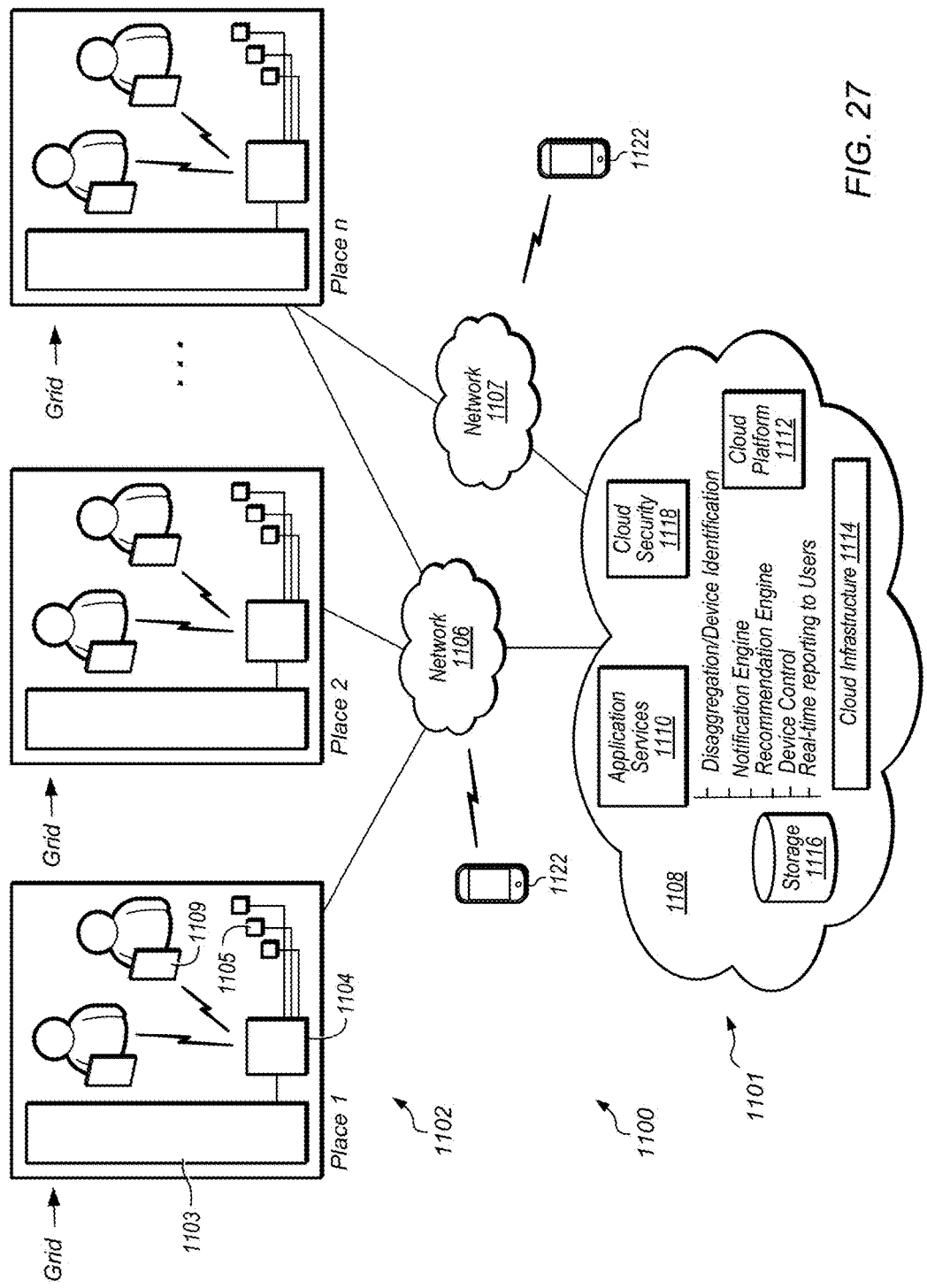
FIG. 27 illustrates one embodiment of a cloud computing system that can be implemented to carry out building intelligence, device disaggregation, notifications, recommendations, and control.

In some embodiments, the system for providing intelligence to home owners or other building occupants are provided by way of a cloud computing system over a communications network. FIG. 27 illustrates one embodiment of a cloud computing system that can be implemented to carry out building intelligence, device disaggregation, notifications, recommendations, and control. System 1100 includes building intelligence system 1101 that provides device disaggregation, notification, and reporting for buildings 1102. Each of places 1102 includes load center 1103, data gathering and reporting server 1104, and building sensors 1105. Load center 1103 receives power from grid for various energy consuming systems and devices at place 1102. Each load center 1103 may include one or more signature capture devices, similar to those described above relative to FIGS. 13 and 24-26. Some or all of the individual occupants at place 1102 may be able to view information on occupant display devices 1109.

Each of computing systems 1102 may be connected to cloud computing system 1108 by way of network 1107. In certain embodiments, occupant display devices 1109 are connected to one another by way of network 1106.

Cloud computing system 1108 may provide remote computing resources, remote storage resources, or both, for systems connected to cloud computing systems 1108. For example, cloud computing system 1108 may provide cloud computing services to users at places 1102. Occupant display devices 1109 may be, for example, workstations or mobile devices.

Various system architectures may be employed in cloud computing system 1108. Systems and components of cloud computing system 1108 may be at a single physical location, such as a data center, or distributed among any number of locations. Cloud computing system 1108 includes cloud application services 1110, cloud platform 1112, cloud infrastructure 1114, cloud data storage 1116, and cloud security 1118. Cloud applications services may be implemented by way of one or more computer systems, each include one or more central processing units, such as described herein. Examples of application services 1110 include providing disaggregation, notification engine, recommendation engine, device control, and reporting. Cloud application services 1110 may access cloud data storage 1116.

Cloud infrastructure 1114 may encompass a variety of physical resources, such as computing devices, servers, block storage, mass storage devices, file servers, software, and network systems. In some embodiments, a cloud computing system encompasses virtualized resources, such as virtualized data storage or virtualized hardware.

In some embodiments, a service provider provides services to occupants of places 1102 by way of cloud computing resources. In some embodiments, computation resources are rented or leased to customers of the service provider. In certain embodiments, services are provided to users at sites as software as a service ("SaaS") or platform as a service ("Paas"). Services may be provided to each user on an on-demand basis.

Networks 1106 and 1107 may include any suitable data network or combination of networks that enable the exchange of information between electronic systems. For example, networks 1106 may include one or more Local Area Networks (LANs) such as Ethernet networks, as well as Wide Area Networks (WANs), Metropolitan Area Networks (MANs), or other data or telecommunication networks implemented over any suitable medium, such as electrical or optical cable, or via any suitable wireless standard such as IEEE 802.11 ("Wi-Fi"), IEEE 802.16 ("WiMax"), etc. In various embodiments, all or a portion of networks 1106 may include the network infrastructure commonly referred to as the Internet. In other embodiments, networks 1106 and 1107 may be entirely contained within an enterprise and not directly accessible from the Internet. In certain embodiments, information may be exchanged over a virtual private network. In one embodiment, information is exchanged over the internet, but encrypted in such a way to make a private network not accessible from the rest of the internet.

In various embodiments, some users may be connected over a different network than other users. For example, as shown in FIG. 27, users may be connected to cloud computing system 1108 over network 1107. In some embodiments, one or more users are connected over a private network. For example, in the embodiment shown in FIG. 27, network 1106 may be a public network and network 1107 may be a private network.

In various embodiments, a user may communicate over systems in system 1100 from locations external to users and cloud computing system 1108. For example, a decision maker may communicate with users at a remote location by way of portable electronic devices 1122. Portable electronic devices 1122 may be located anywhere, including at places 1102 or a remote location.

Although for illustrative purposes only three places are shown in FIG. 27, a system may include monitoring and reporting for number of places and any number of computer systems.

Computer systems may, in various embodiments, include components such as a CPU with an associated memory medium such as Compact Disc Read-Only Memory (CD-ROM). The memory medium may store program instructions for computer programs. The program instructions may be executable by the CPU. Computer systems may further include a display device such as monitor, an alphanumeric input device such as keyboard, and a directional input device such as mouse. Computer systems may be operable to execute the computer programs to implement computer-implemented systems and methods. A computer system may allow access to users by way of any browser or operating system.

Computer systems may include a memory medium on which computer programs according to various embodiments may be stored. The term "memory medium" is intended to include an installation medium, e.g., Compact Disc Read Only Memories (CD-ROMs), a computer system memory such as Dynamic Random Access Memory (DRAM), Static Random Access Memory (SRAM), Extended Data Out Random Access Memory (EDO RAM), Double Data Rate Random Access Memory (DDR RAM), Rambus Random Access Memory (RAM), etc., or a non-volatile memory such as a magnetic media, e.g., a hard drive or optical storage. The memory medium may also include other types of memory or combinations thereof. In addition, the memory medium may be located in a first computer, which executes the programs or may be located in a second different computer, which connects to the first computer over a network. In the latter instance, the second computer may provide the program instructions to the first computer for execution. A computer system may take various forms such as a personal computer system, mainframe computer system, workstation, network appliance, Internet appliance, personal digital assistant ("PDA"), television system or other device. In general, the term "computer system" may refer to any device having a processor that executes instructions from a memory medium.

The memory medium may store a software program or programs operable to implement embodiments as described herein. The software program(s) may be implemented in various ways, including, but not limited to, procedure-based techniques, component-based techniques, and/or object-oriented techniques, among others. For example, the software programs may be implemented using ActiveX controls, C++ objects, JavaBeans, Microsoft Foundation Classes (MFC), browser-based applications (e.g., Java applets), traditional programs, or other technologies or methodologies, as desired. A CPU executing code and data from the memory medium may include a means for creating and executing the software program or programs according to the embodiments described herein.

Although various embodiments herein include a system that provides disaggregation, notifications, monitoring, and recommendations for a residence, disaggregation/notification systems such as described herein may be used for any place, including a set of office buildings, a factory, a school, a sports venue, or a hospital.

Some embodiments are set forth in the following clauses:

H1. A system for providing information about electrical devices in a residence, comprising:
  a power measurement device configured to:
    measure one or more characteristics of electrical power in one or more electrical power lines in the residence;
  an electrical device identification component configured to:
    determine, based at least in part on at least one of the measured electrical characteristics, electrical signatures for each of at least two of a plurality of electrical devices at the residence that are receiving electrical power through the electrical power lines;
    associate, based at least in part on at least one of the electrical signatures, one or more of the electrical devices with a device type; and
    group two or more of the electrical devices into two or more zones of the residence; and
  a notification component configured to:
    determine, based at least in part on power consumption by the at least one specific electrical device detected by the power measurement device, an event or condition associated with the at least one specific electrical device, wherein the power consumption is detected using the electrical signature for the at least one specific electrical device; and
    provide, to a person associated with the residence, one or more notifications relating to at least one of the events or conditions associated with the at least one specific electrical device.

H2. A method of providing information about electrical devices in a residence, comprising:
  measuring one or more characteristics of electrical power lines in the residence;
  determining, based at least in part on the measured electrical characteristics,
    electrical signatures for each of at least two of a plurality of electrical devices at the residence that are receiving electrical power from the electrical power lines;
  associating, based at least in part on at least one of the electrical signatures, one or more of the electrical devices with a device type;
  grouping two or more of the electrical devices into zones of the residence;
  detecting power consumption by at least one specific one of the electrical devices, wherein the power consumption by the specific electrical device is detected by using the electrical signature for the at least one specific electrical device;
  determining, based at least in part on the power consumption detected by the at least one specific electrical device, an event or condition associated with the at least one specific electrical device; and
  providing, to a person associated with the residence, one or more notifications relating to at least one of the events or conditions associated with the at least one specific electrical device.

H3. The method of clause H2, wherein determining the electrical signatures comprises disaggregation of two or more devices in at least one circuit in the home.

H4. The method of clause H2, wherein the zones correspond to one or more rooms of the residence.

H5. The method of clause H2, wherein the zones correspond to one or more functional areas of the residence.

H6. The method of clause H2, wherein the zones correspond to one or more circuits of an electrical power distribution system in the residence.

H7. The method of clause H2, wherein determining the electrical signatures is performed substantially continuously, the method further comprising providing one or more updates about one or more devices in the residence based on changes over time to one or more of the electrical signatures.

H8. The method of clause H2, wherein determining at least one of the electrical signatures comprises transforming signal information from a time domain to a frequency domain.

H9. The method of clause H2, wherein, for at least one of the electrical devices, the frequency of sampling is at least about twice the frequency of the electrical device signature.

H10. The method of clause H2, wherein measuring the one or more characteristics of electrical power lines in the residence comprises measuring current in one or more of the electrical power lines.

H11. The method of clause H2, wherein measuring the one or more characteristics of electrical power lines in the residence comprises measuring voltage in one or more of the electrical power lines.

H12. The method of clause H2, further comprising providing one or more reports to a person associated with the residence, wherein the reports comprise real-time information about use of one or more of the electrical devices measured in the residence.

H13. The method of clause H2, further comprising tracking an on/off state of one or more of the electrical devices.

H14. The method of clause H2, further comprising reporting power consumption of one or more of the disaggregated devices at the residence.

H15. The method of clause H2, wherein the notification relating to at least one of the events or conditions is of an actual adverse event or condition of one of the electrical devices in the residence.

H16. The method of clause H2, wherein the notification relates to at least one of the events or conditions is of abnormal usage of at least one of the specific electrical devices.

H17. The method of clause H2, wherein the notification relating to at least one of the events or conditions comprises notice of an increased likelihood of failure of at least one of the specific electrical devices.

H18. The method of clause H2, wherein the notification relating to at least one of the events or conditions is of higher energy cost for at least one of the electrical devices.

H19. The method of clause H2, wherein the notification relating to at least one of the events or conditions comprises a prediction of one or more adverse events.

H20. The method of clause H2, wherein the notification relating to at least one of the events or conditions comprises a prediction of one or more adverse events, wherein the prediction is based on past usage information measured for the electrical device.

H21. The method of clause H2, wherein the notification relating to at least one of the events or conditions is based at least on one or more historical patterns for at least one of the electrical devices.

H22. The method of clause H2, wherein the notification relating to at least one of the events or conditions is based at least on one or more historical patterns relating to at least one of the electrical devices and on weather data.

H23. The method of clause H2, wherein the notification relating to at least one of the events or conditions is based at least on one or more measurements of the electrical device and one or more conditions external to the device.

H24. The method of clause H2, further comprising making one or more recommendations about one of the electrical devices based in part on measurements taken for the specific electrical device.

H25. The method of clause H2, further comprising making one or more recommendations about one of the electrical devices based in part on measurements taken for the specific electrical device, wherein the one or more recommendations includes a repair option and a replace option.

H26. The method of clause H2, further comprising making one or more purchase recommendations relating to at least one of the electrical devices, wherein the recommendation is based in part on measurements taken for the specific electrical device.

H27. The method of clause H2, further comprising controlling one or more of the electrical devices based on at least one of the notifications.

H28. The method of clause H2, further comprising controlling one or more of the electrical devices from a remote location based on at least one of the notifications.

H29. The method of clause H2, further comprising displaying information about one or more electrical devices in the residence on a mobile device.

H30. The method of clause H2, further comprising providing one or more notifications to a person associated with a residence, wherein the notification is based on smart meter data from the residence and analysis of one or more of specific electrical devices.

I1. A method of providing information about electrical devices in a residence, comprising:
 measuring one or more characteristics of electrical power lines in the residence;
 determining, based at least in part on the measured electrical characteristics, electrical signatures for each of at least two of a plurality of electrical devices at the residence that are receiving electrical power from the electrical power lines;
 detecting a state or usage level of at least one specific one of the electrical devices, wherein the state or usage level of by the specific electrical device is detected by using the electrical signature for the at least one specific electrical device;
 determining, based at least in part on the state or usage level detected by the at least one specific electrical device, an event or condition associated with the at least one specific electrical device; and
 providing, to a person associated with the residence, one or more notifications relating to at least one of the events or conditions associated with the at least one specific electrical device.

I2. The method of clause I1, wherein at least one of the events or conditions is determined based on the state of two or more of the electrical devices.

I3. The method of clause I1, wherein the notification is based on information about use of two or more electrical devices monitored using electrical signatures.

I4. The method of clause I1, wherein determining the electrical signatures comprises disaggregation of two or more devices in at least one circuit in the home.

I5. The method of clause I1, wherein the zones correspond to one or more rooms of the residence.

I6. The method of clause I1, wherein determining the electrical signatures comprises disaggregation of two or more devices in at least one circuit in the home.

I7. The method of clause I1, wherein the zones correspond to one or more rooms of the residence.

I8. The method of clause I1, wherein the zones correspond to one or more functional areas of the residence.

I9. The method of clause I1, wherein the zones correspond to one or more circuits of an electrical power distribution system in the residence.

I10. The method of clause I1, wherein determining the electrical signatures is performed substantially continuously, the method further comprising providing one or more updates about one or more devices in the residence based on changes over time to one or more of the electrical signatures.

I11. The method of clause I1, wherein determining at least one of the electrical signatures comprises transforming signal information from a time domain to a frequency domain.

I12. The method of clause I1, wherein, for at least one of the electrical devices, the frequency of sampling is at least about twice the frequency of the electrical device signature.

I13. The method of clause I1, wherein measuring the one or more characteristics of electrical power lines in the residence comprises measuring current in one or more of the electrical power lines.

I14. The method of clause I1, wherein measuring the one or more characteristics of electrical power lines in the residence comprises measuring voltage in one or more of the electrical power lines.

I15. The method of clause I1, further comprising providing one or more reports to a person associated with the residence, wherein the reports comprise real-time information about use of one or more of the electrical devices measured in the residence.

I16. The method of clause I1, further comprising tracking an on/off state of one or more of the electrical devices.

I17. The method of clause I1, further comprising reporting power consumption of one or more of the disaggregated devices at the residence.

I18. The method of clause I1, wherein the notification relating to at least one of the events or conditions is of an actual adverse event or condition of one of the electrical devices in the residence.

I19. The method of clause I1, wherein the notification relates to at least one of the events or conditions is of abnormal usage of at least one of the specific electrical devices.

I20. The method of clause I1, wherein the notification relating to at least one of the events or conditions comprises notice of an increased likelihood of failure of at least one of the specific electrical devices.

I21. The method of clause I1, wherein the notification relating to at least one of the events or conditions is of higher energy cost for at least one of the electrical devices.

I22. The method of clause I1, wherein the notification relating to at least one of the events or conditions comprises a prediction of one or more adverse events.

I23. The method of clause I1, wherein the notification relating to at least one of the events or conditions comprises a prediction of one or more adverse events, wherein the prediction is based on past usage information measured for the electrical device.

I24. The method of clause I1, wherein the notification relating to at least one of the events or conditions is based at least on one or more historical patterns for at least one of the electrical devices.

I25. The method of clause I1, wherein the notification relating to at least one of the events or conditions is based at least on one or more historical patterns relating to at least one of the electrical devices and on weather data.

I26. The method of clause I1, wherein the notification relating to at least one of the events or conditions is based at least on one or more measurements of the electrical device and one or more conditions external to the device.

I27. The method of clause I1, further comprising making one or more recommendations about one of the electrical devices based in part on measurements taken for the specific electrical device.

I28. The method of clause I1, further comprising making one or more recommendations about one of the electrical devices based in part on measurements taken for the specific electrical device, wherein the one or more recommendations includes a repair option and a replace option.

I29. The method of clause I1, further comprising making one or more purchase recommendations relating to at least one of the electrical devices, wherein the recommendation is based in part on measurements taken for the specific electrical device.

I30. The method of clause I1, further comprising controlling one or more of the electrical devices based on at least one of the notifications.

I31. The method of clause I1, further comprising controlling one or more of the electrical devices from a remote location based on at least one of the notifications.

I32. The method of clause I1, further comprising displaying information about one or more electrical devices in the residence on a mobile device.

I33. The method of clause I1, further comprising providing one or more notifications to a person associated with a residence, wherein the notification is based on smart meter data from the residence and analysis of one or more of specific electrical devices.

J1. A method of managing electrical devices in a residence, comprising:
  measuring one or more characteristics of electrical power lines in the residence;
  determining, based at least in part on the measured electrical characteristics, electrical signatures for each of a plurality of electrical devices at the residence that are receiving electrical power from the electrical power lines;
  detecting use by at least one specific one of the electrical devices, wherein the use by the specific electrical device is detected by using the electrical signature for the at least one specific electrical device;
  providing, to a person associated with the residence, one or more device-specific notifications relating to at least one of the electrical devices in the residence; and
  controlling, in response to at least one of the device-specific notifications, one or more of the electrical devices in the residence.

J2. The method of clause J1, wherein controlling at least one of the electrical devices comprises sending an instruction to the at least one device over electrical power lines in the residence using power line communication.

J3. The method of clause J1, wherein at least one of the notifications is by zone.

J4. The method of clause J1, wherein controlling at least one of the electrical devices comprises receiving at least one instruction from the person to whom at least one of the notifications was provided.

K1. A method of providing information about electrical devices in a residence, comprising:
  measuring one or more characteristics of electrical power lines in the residence;

determining, based at least in part on the measured electrical characteristics, electrical signatures for at least two of a plurality of electrical devices at the residence that are receiving electrical power from the electrical power lines;

detecting use of at least one specific one of the electrical devices, wherein the use by the specific electrical device is detected by using the electrical signature for the at least one specific electrical device;

determining, based at least in part on the use detected by the at least one specific electrical device, a suggestion for acquiring one or more products or one or more services; and providing the suggestion to a person associated with the residence.

K2. The method of clause K1, wherein at least one of the suggestions is based on frequency of use of at least one of the devices.

K3. The method of clause K1, wherein at least one of the suggestions is based on promoting enhanced enjoyment of at least one of the electrical devices in the residence.

K4. The method of clause K1, wherein at least one of the suggestions is for acquisition of a product or service related to at least one of the electrical devices in the residence.

K5. The method of clause K1, wherein at least one of the suggestions includes a promotion for at least one item.

K6. The method of clause K1, wherein at least one of the suggestions is based on an actual failure of at least one of the electrical devices.

K7. The method of clause K1, wherein at least one of the suggestions is based on a likelihood of failure of at least one of the electrical devices.

K8. The method of clause K1, wherein at least one of the suggestions is based on degradation of at least one of the electrical devices.

K9. The method of clause K1, wherein at least one of the suggestions is based on excess power usage by at least one of the electrical devices.

L1. A method of managing levels of power consumption of electrical devices used by an organization in its facilities, comprising:

measuring one or more characteristics of electrical power lines in the set of one or more buildings in which the organization operates;

determining, based at least in part on the measured electrical characteristics, electrical signatures for at least two specific devices of a plurality of electrical devices at the one or more buildings that are receiving electrical power from the electrical power lines;

detecting power consumption of at least one specific one of the electrical devices, wherein the power consumption by the at least two specific electrical devices is detected by using the electrical signatures for the at least two specific electrical devices; and determining, based at least in part on the power consumption detected by the at least two specific electrical devices, one or more operating specifications for the at least two electrical devices at the one or more buildings, wherein the one or more operational specifications manage a power consumption for electrical loads at the set of one or more buildings.

L2. The method of clause L1, wherein the operating specifications are configured to reduce peak power consumption for electrical loads at the set of one or more buildings.

M1. A system, comprising:

a plurality of conductors configured to couple with one or more sensors, wherein the sensors are configured to measure characteristics of power in electrical power lines;

an analog-to-digital converter configured to receive signals from the electrical power lines and convert the signals from analog signals to digital signals;

one or more processors configured to:
receive, from the analog-to-digital converter, one or more digital signals;
perform digital signal processing on at least one of the signals;
determine, based on the digital signal processing, an electrical signature for at least one electrical device receiving power from at least one of the electrical power lines.

M2. The system of clause M1, wherein the system is configured to couple with one or more electrical power lines at a breaker box of a residence.

M3. The system of clause M1, wherein the electrical power lines supply power to electrical devices in a residence, wherein the system comprises a notification component configured to generate one or more notifications about events or conditions relating to electrical devices at the residence.

M4. The system of clause M1, wherein the electrical power lines supply power to electrical devices in a residence, wherein the system further comprises a control component configured to generate a control signal to one or more electrical devices at the residence based on information about one or more specific devices in the residence acquired using at least one of the electrical signatures.

M5. The system of clause M1, wherein the electrical power lines supply power to electrical devices in a residence, wherein the system further comprises a control component configured to generate a control signal to one or more electrical devices at the residence based on information about one or more specific devices in the residence.

M6. The system of clause M1, wherein the electrical power lines supply power to electrical devices in a residence, wherein the system is configured to send one or more notifications by way of power line communications over electrical power lines in the residence.

M7. The system of clause M1, wherein the electrical power lines supply power to electrical devices in a residence, wherein the system is configured to send one or more control signals by way of power line communications over electrical power lines in the residence.

M8. A electrical signature capture pre-processing device, comprising:

a plurality of conductors configured to couple with one or more electrical sensors, wherein the sensors are configured to measure characteristics of power in electrical power lines in a building;

an analog-to-digital converter configured to receive signals from the electrical power lines and convert the signals from analog signals to digital signals; and an electrical signature pre-processing component, implemented on one or more processors, configured to:
receive, from the analog-to-digital converter, one or more digital signals;
perform digital signal processing on at least one of the signals to determine a set of information for computing an electrical signature for at least one specific electrical device in the building; and send information to an electrical signature computation component, wherein the information sent to the electrical signature computation component includes information for determining an electrical signature for at least one specific electrical device in the one or more buildings; and a microcontroller configured to control one or more of the electrical devices in the building.

M9. A system, comprising:

a plurality of conductors configured to couple with one or more sensors, wherein the sensors are configured to measure characteristics of power in electrical power lines;

one or more processors configured to:
perform signal processing on at least one of signals; and
determine, based on the signal processing, an electrical signature for at least one electrical device receiving power from at least one of the electrical power lines.

M10. A method of providing information about electrical devices in a place, comprising:

measuring one or more characteristics of electrical power lines in a place;

determining, based at least in part on the measured electrical characteristics, electrical signatures for each of at least two of a plurality of electrical devices at the place that are receiving electrical power from the electrical power lines; and detecting a state or usage level of at least one specific one of the electrical devices, wherein the state or usage level of by the specific electrical device is detected by using the electrical signature for the at least one specific electrical device.

N1. A system for monitoring use of a liquid resource, comprising:

one or more sensors configured to measure flow of a liquid resource being used by an entity at a first place; and a monitoring system coupled to at least one of the sensors, wherein the monitoring system is configured to automatically:
receive information about the flow rate of the liquid from at least one of the sensors;
acquire values associated with use of a liquid resource by the entity at the first place;
perform a normalization of at least one of the values; and
display, to at least one person of the entity, while the resource is being consumed at the first place by the entity, one or more comparisons based on at least one of the normalized values associated with consumption of the resource at the first place and one or more other values associated with consumption of the resource.

N2. The system of clause N1, wherein the liquid resource comprises water.

N3. The system of clause N1, wherein the liquid resource comprises oil.

N4. The system of clause N1, wherein the monitoring system is further configured to:
measure consumption of electricity at the place by the entity; and
simultaneously report to a user both electrical usage information and liquid usage information.

N5. A method of monitoring use of a liquid resource, comprising:
acquiring, by a computer system, values associated with use of a liquid resource by an entity at a first place;
performing, by the computer system, a normalization of at least one of the values; and
displaying, to at least one person of the entity, while the resource is being consumed at the first place by the entity, one or more comparisons based on at least one of the normalized values associated with consumption of the resource at the first place and one or more other values associated with consumption of the resource.

N6. The method of clause N5, wherein the liquid resource is water, wherein the values associated with the use of the liquid resource comprises a flow rate of the water.

N7. The method of clause N5, wherein the liquid resource is oil, wherein the values associated with the use of the liquid resource comprises a flow rate of the oil.

N8. The method of clause N5, wherein at least one of the displayed comparisons comprises a real-time display of consumption by the first entity.

N9. The method of clause N5, wherein the entity is an individual person, wherein at least one of the comparisons is displayed to the individual person while individual person is consuming the resource at the first place.

N10. The method of clause N5, wherein the comparison comprises a comparison of consumption of the resource by the entity with consumption of the resource by at least one other entity.

N11. The method of clause N5, wherein the comparison comprises a comparison of current consumption by the entity with consumption by the entity at a different time or under different conditions.

N12. The method of clause N5, wherein acquiring values associated with consumption of the resource at the first place comprises measuring consumption of the resource at the first place.

N13. The method of clause N5, wherein the first place is a building.

N14. The method of clause N5, wherein the entity comprises occupants of the first place.

N15. The method of clause N5, further comprising:
measuring consumption of electricity at the place by the entity; and
simultaneously reporting to a user both electrical usage information and liquid usage information.

O1. A system for monitoring use of a gas resource, comprising:

one or more sensors configured to measure flow of gas being used by an entity at a first place; and a monitoring system coupled to at least one of the sensors, wherein the monitoring system is configured to automatically:
receive information about the flow rate of the gas from at least one of the sensors;
acquire values associated with use of the gas by the entity at the first place;
perform a normalization of at least one of the values; and
display, to at least one person of the entity, while the gas resource is being consumed at the first place by the entity, one or more comparisons based on at least one of the normalized values associated with consumption of the resource at the first place and one or more other values associated with consumption of the resource.

O2. The system of clause O1, wherein the monitoring system is further configured to:
measure consumption of electricity at the place by the entity; and
simultaneously report to a user both electrical usage information and gas usage information.

O3. A method of monitoring use of a gas, comprising:
acquiring, by a computer system, values associated with use of a gas resource by an entity at a first place;
performing, by the computer system, a normalization of at least one of the values; and
displaying, to at least one person of the entity, while the resource is being consumed at the first place by the entity, one or more comparisons based on at least one of the normalized values associated with consumption of the resource at the first place and one or more other values associated with consumption of the resource.

O4. The method of clause O3, wherein the values associated with the use of the gas resource comprises a flow rate of the gas.

O5. The method of clause O3, wherein at least one of the displayed comparisons comprises a real-time display of consumption by the first entity.

O6. The method of clause O3, wherein the entity is an individual person, wherein at least one of the comparisons is displayed to the individual person while individual person is consuming the resource at the first place.

O7. The method of clause O3, wherein the comparison comprises a comparison of consumption of the resource by the entity with consumption of the resource by at least one other entity.

O8. The method of clause O3, wherein the comparison comprises a comparison of current consumption by the entity with consumption by the entity at a different time or under different conditions.

O9. The method of clause O3, wherein acquiring values associated with consumption of the resource at the first place comprises measuring consumption of the resource at the first place.

O10. The method of clause O3, wherein the first place is a building.

O11. The method of clause O3, wherein the entity comprises occupants of the first place.

O12. The method of clause O3, further comprising:
measuring consumption of electricity at the place by the entity; and
simultaneously reporting to a user both electrical usage information and gas usage information.

P1. A system for monitoring use of a liquid resource, comprising:
one or more sensors configured to measure flow of a liquid resource being used by an entity at a first place; and
a monitoring system coupled to at least one of the sensors, wherein the monitoring system is configured to automatically:
measure one or more flow characteristics of a liquid resource in the residence;
detect a state or usage level of the liquid resource of at least one specific device;
determine, based at least in part on the state or usage level detected by the at least one specific device, an event or condition associated with the at least one specific device; and
provide, to a person associated with the residence, one or more notifications relating to at least one of the events or conditions associated with the at least one specific device.

P2. The system of clause P1, wherein the liquid resource comprises water.

P3. The system of clause P1, wherein the liquid resource comprises oil.

P4. The system of clause P1, wherein the monitoring system is further configured to:
measure consumption of electricity at the place by the entity; and
simultaneously report to a user both electrical usage information and liquid usage information.

P5. A method of monitoring use of a liquid resource in a residence, comprising:
measuring one or more flow characteristics of a liquid resource in the residence;
detecting a state or usage level of the liquid resource of at least one specific device;
determining, based at least in part on the state or usage level detected by the at least one specific device, an event or condition associated with the at least one specific device; and
providing, to a person associated with the residence, one or more notifications relating to at least one of the events or conditions associated with the at least one specific device.

P6. The method of clause P5, wherein the liquid resource is water.

P7. The method of clause P5, wherein the liquid resource is oil.

P8. The method of clause P5, wherein at least one of the events or conditions is determined based on the state of two or more of the devices.

P9. The method of clause P5, wherein the notification is based on information about use of two or more devices monitored.

P10. The method of clause P5, further comprising tracking an on/off state of one or more of the devices.

P11. The method of clause P5, wherein the notification relating to at least one of the events or conditions is of an actual adverse event or condition of one of the devices in the residence.

P12. The method of clause P5, wherein the notification relates to at least one of the events or conditions is of abnormal usage of at least one of the specific devices.

P13. The method of clause P5, wherein the notification relating to at least one of the events or conditions comprises notice of an increased likelihood of failure of at least one of the specific devices.

P14. The method of clause P5, wherein the notification relating to at least one of the events or conditions is of higher energy cost for at least one of the devices.

P16. The method of clause P5, wherein the notification relating to at least one of the events or conditions comprises a prediction of one or more adverse events.

P17. The method of clause P5, wherein the notification relating to at least one of the events or conditions comprises a prediction of one or more adverse events, wherein the prediction is based on past usage information measured for the device.

P18. The method of clause P5, wherein the notification relating to at least one of the events or conditions is based at least on one or more historical patterns for at least one of the devices.

P19. The method of clause P5, wherein the notification relating to at least one of the events or conditions is based at least on one or more measurements of the device and one or more conditions external to the device.

P20. The method of clause P5, further comprising making one or more recommendations about one of the devices based in part on measurements taken for the specific device.

P21. The method of clause P5, further comprising making one or more recommendations about one of the devices based in part on measurements taken for the specific device, wherein the one or more recommendations includes a repair option and a replace option.

P22. The method of clause P5, further comprising making one or more purchase recommendations relating to at least one of the devices, wherein the recommendation is based in part on measurements taken for the specific device.

P23. The method of clause P5, further comprising controlling one or more of the devices based on at least one of the notifications.

P24. The method of clause P5, further comprising controlling one or more of the devices from a remote location based on at least one of the notifications.

P25. The method of clause P5, further comprising displaying information about one or more devices in the residence on a mobile device.

P26. The method of clause P5, further comprising:
measuring consumption of electricity at the place by the entity; and
simultaneously reporting to a user both electrical usage information and liquid resource usage information.

Q1. A system for monitoring use of a gas resource, comprising:
one or more sensors configured to measure flow of a gas resource being used by an entity at a first place; and
a monitoring system coupled to at least one of the sensors, wherein the monitoring system is configured to automatically:
measure one or more flow characteristics of a gas resource in the residence;
detect a state or usage level of the gas resource of at least one specific device;
determine, based at least in part on the state or usage level detected by the at least one specific device, an event or condition associated with the at least one specific device; and
provide, to a person associated with the residence, one or more notifications relating to at least one of the events or conditions associated with the at least one specific device.

Q2. The system of clause Q1, wherein the monitoring system is further configured to:
measure consumption of electricity at the place by the entity; and
simultaneously report to a user both electrical usage information and gas usage information.

Q3. A method of monitoring use of a gas resource in a residence, comprising:
measuring one or more flow characteristics of gas in the residence;
detecting a state or usage level of the gas resource of at least one specific device;
determining, based at least in part on the state or usage level detected by the at least one specific device, an event or condition associated with the at least one specific device; and
providing, to a person associated with the residence, one or more notifications relating to at least one of the events or conditions associated with the at least one specific device.

Q4. The method of clause Q3, wherein at least one of the events or conditions is determined based on the state of two or more of the devices.

Q5. The method of clause Q3, wherein the notification is based on information about use of two or more devices monitored.

Q6. The method of clause Q3, further comprising tracking an on/off state of one or more of the devices.

Q7. The method of clause Q3, wherein the notification relating to at least one of the events or conditions is of an actual adverse event or condition of one of the devices in the residence.

Q8. The method of clause Q3, wherein the notification relates to at least one of the events or conditions is of abnormal usage of at least one of the specific devices.

Q9. The method of clause Q3, wherein the notification relating to at least one of the events or conditions comprises notice of an increased likelihood of failure of at least one of the specific devices.

Q10. The method of clause Q3, wherein the notification relating to at least one of the events or conditions is of higher energy cost for at least one of the devices.

Q11. The method of clause Q3, wherein the notification relating to at least one of the events or conditions comprises a prediction of one or more adverse events.

Q12. The method of clause Q3, wherein the notification relating to at least one of the events or conditions comprises a prediction of one or more adverse events, wherein the prediction is based on past usage information measured for the device.

Q13. The method of clause Q3, wherein the notification relating to at least one of the events or conditions is based at least on one or more historical patterns for at least one of the devices.

Q14. The method of clause Q3, wherein the notification relating to at least one of the events or conditions is based at least on one or more measurements of the device and one or more conditions external to the device.

Q15. The method of clause Q3, further comprising making one or more recommendations about one of the devices based in part on measurements taken for the specific device.

Q16. The method of clause Q3, further comprising making one or more recommendations about one of the devices based in part on measurements taken for the specific device, wherein the one or more recommendations includes a repair option and a replace option.

Q17. The method of clause Q3, further comprising making one or more purchase recommendations relating to at least one of the devices, wherein the recommendation is based in part on measurements taken for the specific device.

Q18. The method of clause Q3, further comprising controlling one or more of the devices based on at least one of the notifications.

Q19. The method of clause Q3, further comprising controlling one or more of the devices from a remote location based on at least one of the notifications.

Q20. The method of clause Q3, further comprising displaying information about one or more devices in the residence on a mobile device Q21. The method of clause Q3, further comprising:
measuring consumption of electricity at the place by the entity; and
simultaneously reporting to a user both electrical usage information and gas usage information.

Further modifications and alternative embodiments of various aspects of the invention may be apparent to those skilled in the art in view of this description. Accordingly, this description is to be construed as illustrative only and is for the purpose of teaching those skilled in the art the general manner of carrying out the invention. It is to be understood that the forms of the invention shown and described herein are to be taken as embodiments. Elements and materials may be substituted for those illustrated and described herein, parts and processes may be reversed, and certain features of the invention may be utilized independently, all as would be apparent to one skilled in the art after having the benefit of this description of the invention. Methods may be implemented manually, in software, in hardware, or a combination thereof. The order of any method may be changed, and various elements may be added, reordered, combined, omitted, modified, etc. Changes may be made in the elements described herein without departing from the spirit and scope of the invention as described in the following claims.

What is claimed is:

1. A system, comprising:
a plurality of conductors configured to couple with one or more sensors, wherein the sensors are configured to measure a plurality of electrical load characteristics in one or more electrical power line circuits of a building;
an analog-to-digital converter coupled to the plurality of conductors, the analog-to digital converter configured to receive signals corresponding to the plurality of electrical load characteristics from the one or more sensors and convert the signals from analog signals to digital signals; and
one or more remote processors, coupled to the analog-to-digital converter, configured to:
receive, from the analog-to-digital converter, one or more of the digital signals corresponding to the plurality of electrical load characteristics;
perform digital signal processing on at least one of the one or more digital signals; and
determine, based on the digital signal processing, an electrical signature for at least one electrical device receiving power from at least one of the one or more electrical power line circuits, wherein the electrical signature comprises at least a phase angle and a frequency harmonics of the power being received; and
identify the at least one electrical device based on the electrical signature of the at least one electrical device.

2. The system of claim 1, wherein the one or more electrical power line circuits are at a breaker box of the building.

3. The system of claim 1, wherein the one or more remote processors comprise:
an electrical signature computation component, wherein the electrical signature computation component performs digital signal processing on the one or more digital signals to determine an electrical signature for at least one specific electrical device in the building that receive power from one of the one or more electrical power line circuits; and
a microcontroller configured to control one or more of the electrical devices in the building, using the determined electrical signatures.

4. The system of claim 1, wherein the one or more sensors are coupled to one or more electrical power line circuits emanating from a circuit breaker box.

5. The system of claim 1, wherein determining at least one of the electrical signatures comprises transforming one or more of the digital signals from a time domain to a frequency domain.

6. The system of claim 1, wherein determining the electrical signatures is performed substantially continuously, the one or more remote processors further configured to provide one or more updates to the electronical signature of the one or more devices based on changes in the electrical signature over time.

7. The system of claim 1, wherein for at least one of the electrical devices, a frequency of sampling is at least about twice a highest frequency of the electronic signature of the at least one electrical device.

8. The system of claim 1, wherein the one or more remote processors are further configured to associate a location of an electrical device with the electronic signature of the electrical device.

9. The system of claim 1, wherein determining the electrical signatures comprises disaggregation of two or more devices connected to at least one of the one or more electrical power line circuits in the building.

10. The system of claim 1, wherein the system further comprises a control component configured to generate and send a control signal to the one or more electrical devices receiving power from at least one of the one or more electrical power line circuits.

11. The system of claim 1, wherein the plurality of measured electrical load characteristics comprise energy consumption and at least one additional electrical load characteristic.

12. The system of claim 1, wherein the electrical signature comprises at least one of a voltage, a current, a power factor, an amplitude of the power being received.

13. The system of claim 1, wherein the phase angle and the frequency harmonics for the at least one electrical device are derived from the measured electrical load characteristics of the at least one electrical device.

14. A method of determining an electrical signature for one or more electrical devices being operated in a building, comprising:
measuring a plurality of electrical load characteristics of one or more electrical power line circuits in the building;
converting one or more of the measured electrical load characteristics from analog signals to digital signals;
receiving, at one or more remote processors, the digital signals corresponding to the plurality of electrical load characteristics;
determining, using the one or more remote processors, based on processing of the digital signals, an electrical signature for at least one electrical device receiving power from at least one of the one or more electrical power line circuits, wherein the electrical signature comprises at least a phase angle and a frequency harmonics of the power being received; and
identifying, using the one or more remote processors, the at least one electrical device based on the electrical signature of the at least one electrical device.

15. The method of claim 14, wherein the one or more electrical power line circuits are at a breaker box of the building.

16. The method of claim 14, wherein one or more sensors, coupled to one or more of the electrical power line circuits emanating from a circuit breaker box of the building, are used to measure the one or more electrical load characteristics of the one or more electrical power line circuits in the building.

17. The method of claim 14, wherein determining at least one of the electrical signatures comprises transforming one or more of the digital signals from a time domain to a frequency domain.

18. The method of claim 14, wherein determining at least one of the electrical signatures is performed substantially continuously, and wherein the method further comprises providing one or more updates to the electronical signature of the one or more devices based on changes in the electrical signature over time.

19. The method of claim 14, wherein measuring one or more electrical load characteristics of one or more electrical power line circuits comprises sampling the electrical load characteristics at a frequency that is at least twice a highest frequency of the electronic signature of the at least one electrical device.

20. The method of claim 14, further comprising associating a location of an electrical device within the building with the electronic signature of the electrical device.

21. The method of claim 14, wherein determining the electrical signatures comprises disaggregation of two or more devices connected to at least one of the one or more electrical power line circuits in the building.

22. The method of claim 14, further comprising sending a control signal to the one or more electrical devices receiving power from at least one of the one or more electrical power line circuits.

23. The method of claim 14, wherein measuring one or more electrical load characteristics of the one or more electrical power line circuits comprises measuring the current and voltage of the one or more electrical power line circuits.

24. The method of claim 14, wherein the plurality of measured electrical load characteristics comprise energy consumption and at least one additional electrical load characteristic.

25. The method of claim 14, wherein the electrical signature comprises at least one of a voltage, a current, a power factor, an amplitude of the power being received.

26. The method of claim 14, wherein determining the electrical signature comprises deriving the phase angle and the frequency harmonics from the measured electrical load characteristics of the at least one electrical device.

* * * * *